United States Patent
Nakayama et al.

(10) Patent No.: US 7,257,792 B2
(45) Date of Patent: Aug. 14, 2007

(54) WIRING BOARD DESIGN AIDING APPARATUS, DESIGN AIDING METHOD, STORAGE MEDIUM, AND COMPUTER PROGRAM

(75) Inventors: Takeshi Nakayama, Katano (JP); Hiroshi Ikeda, Kyoto (JP); Shinichi Tanimoto, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/151,368

(22) Filed: May 20, 2002

(65) Prior Publication Data

US 2002/0178429 A1 Nov. 28, 2002

(30) Foreign Application Priority Data

May 22, 2001 (JP) ............................. 2001-152004

(51) Int. Cl.
G06F 17/50 (2006.01)
(52) U.S. Cl. .................... 716/11; 716/8; 716/9; 716/10
(58) Field of Classification Search .............. 716/8–15, 716/21; 700/121
See application file for complete search history.

(56) References Cited

U.S. PATENT DOCUMENTS

| | | | | |
|---|---|---|---|---|
| 3,567,914 A | * | 3/1971 | Neese et al. ................... | 716/15 |
| 4,855,929 A | * | 8/1989 | Nakajima ..................... | 716/12 |
| 5,258,920 A | * | 11/1993 | Haller et al. .................. | 716/12 |
| 5,745,371 A | * | 4/1998 | Shouen ......................... | 716/15 |
| 5,781,446 A | * | 7/1998 | Wu ................................ | 716/9 |
| 5,847,968 A | * | 12/1998 | Miura et al. .................... | 716/8 |
| 6,110,213 A | * | 8/2000 | Vinciarelli et al. ............. | 703/1 |
| 6,526,555 B1 | * | 2/2003 | Teig et al. ..................... | 716/11 |
| 6,529,790 B1 | * | 3/2003 | Magee et al. ............... | 700/121 |
| 6,557,154 B1 | * | 4/2003 | Harada et al. ................. | 716/11 |
| 6,557,162 B1 | * | 4/2003 | Pierrat .......................... | 716/21 |
| 6,564,355 B1 | * | 5/2003 | Smith et al. ................... | 716/4 |
| 6,629,302 B2 | * | 9/2003 | Miura et al. ................... | 716/8 |
| 6,691,296 B1 | * | 2/2004 | Nakayama et al. ........... | 716/15 |

FOREIGN PATENT DOCUMENTS

JP 11328235 11/1999

* cited by examiner

Primary Examiner—Thuan Do
Assistant Examiner—Naum B. Levin

(57) ABSTRACT

In a design aiding apparatus of the present invention, a plane clearance setting unit acquires information showing a predetermined margin, a component placement unit determines a placement area of a component such that, as seen in a lamination direction of a multilayer wiring board, at least one of the component and a pad connected to the component is included within a candidate area of a plane foil excluding a perimeter area, and a wiring unit determines a placement area of a wiring foil and a via in the same way that the placement area of the component is determined. Furthermore, in regard to a component, a component pad, a wiring foil, and a via whose placement areas have already been determined, a component placement inspection unit reports a design condition violation if the placement area of at least one of the component and the pad deviates outside the candidate area as seen in the lamination direction of the board, and a wiring inspection unit reports a design condition violation if the placement area of the wiring foil or the via deviates outside the candidate area as seen in the lamination direction of the board.

17 Claims, 27 Drawing Sheets

Fig.2

| Command Classification | Parameters |
|---|---|
| Plane Clearance Setting(1) | 0.2, 2.0, 2.0, 2.0, 0.2, 2.0 |
| Plane Clearance Setting(2) | IC1, 2.0, 2.0, 2.0, 2.0, 2.0 |
| Plane Clearance Setting(3) | clk1, 2.0, 2.0 |
| Plane Placement | p1, gnd1, 3, (5.0, 5.0), (95.0, 5.0), ··· |
| Component Placement | 1, IC1, IC2, ··· |
| Wiring | clk1, ··· |
| Component Placement Inspection | 1, IC1, IC2, ··· |
| Wiring Inspection | clk1, ··· |

Fig.6

Board Information Table

| Structural Points [mm] | No. of Wiring Surfaces |
|---|---|
| (0.0, 0.0), (130.0, 0.0), (130.0, 80.0), (95.0, 80.0), (95.0, 100.0), (0.0, 100.0) | 4 |

Component Master Information Table

| Classification | Type | No. of Pins | Form |
|---|---|---|---|
| MN1 | IC | 48 | QFP1 |
| MN2 | IC | 14 | BGA1 |
| MN3 | IC | 14 | BGA1 |
| ... | ... | ... | ... |
| EC1 | C | 2 | SOP11 |
| EC2 | C | 2 | SOP11 |
| EC3 | C | 2 | SOP11 |

Component Form Information Table 420

| Form 421 | Main Body Area [mm] 422 | Pin No. 423 | Component Pad Area [mm] 424 | Inclusive Area [mm] 425 | Offset Area [mm] 426 |
|---|---|---|---|---|---|
| QFP1 | (0.0, 0.0)(15.0, 15.0) | 1 | (−0.1, 0.25)(0.1, 0.35) | (−0.1, −0.1) (15.1, 15.1) | (−0.1, −0.1) (16.0, 16.0) |
| | | 2 | (−0.1, 0.45)(0.1, 0.55) | | |
| | | ... | ... | | |
| BGA1 | (0.0, 0.0)(13.0, 13.0) | 1 | (−0.1, 0.15)(0.1, 0.25) | (−0.1, −0.1) (13.1, 13.1) | (−0.1, −0.1) (14.0, 14.0) |
| | | 2 | (−0.1, 0.35)(0.1, 0.45) | | |
| | | ... | ... | | |
| SOP1 | (0.0, 0.0)(10.0, 15.0) | 1 | (−0.1, 0.15)(0.1, 0.25) | (−0.1, 0.0) (10.1, 15.0) | (−0.1, −0.1) (11.0, 16.0) |
| | | 2 | (−0.1, 0.35)(0.1, 0.45) | | |
| | | ... | ... | | |
| ... | | | | ... | ... |
| SOP11 | (0.0, 0.0)(1.0, 0.5) | 1 | (0.0, 0.2)(0.2, 0.3) | (0.0, 0.0) (1.0, 0.5) | (−0.1, −0.1) (2.0, 1.5) |
| | | 2 | (0.7, 0.2)(0.9, 0.3) | | |

Fig.9

Component Information Table 430

| ID Name 431 | Classification 432 | Component Pad Clearance [mm] 433 | Component Clearance [mm] 434 | Inclusive Area Clearance [mm] 435 | Offset Area Clearance [mm] 436 |
|---|---|---|---|---|---|
| IC1 | MN1 | 2.0 | 2.0 | 2.0 | 2.0 |
| IC2 | MN2 | 2.0 | 2.0 | 2.0 | 2.0 |
| IC3 | MN3 | — | — | — | — |
| ... | ... | ... | ... | ... | ... |

Fig.10

Net Information Table 440

| Net ID Name 441 | Pin ID Name 442 | Frequency [MHz] 443 | Rise Time [ns] 444 | Delay Time [ns] 445 | Net Type 446 | Wiring Foil Clearance [mm] 447 | Via Pad Clearance [mm] 448 | Foil Width [mm] 449 |
|---|---|---|---|---|---|---|---|---|
| clk1 | IC1-5, IC2-4 | 30 | 1.4 | 1.35 | clock | 2.0 | 2.0 | 0.1 |
| clk3 | IC1-20, IC2-2, IC3-2, IC4-2 | 16 | 1.5 | 1.48 | clock | 2.0 | 2.0 | 0.15 |
| n1 | IC1-2, R1-1 | — | — | — | general | — | — | 0.15 |
| n101 | R1-2, IC4-12 | 30 | 1.4 | 1.35 | clock | — | — | 0.1 |
| gnd1 | IC1-4, IC1-6, IC1-15,..., IC2-6, IC2-10..., C1-1, C2-1, C3-1, ... | — | — | — | ground | — | — | |
| ⋮ | ⋮ | ⋮ | ⋮ | ⋮ | ⋮ | ⋮ | ⋮ | ⋮ |

Component Placement Information Table

| ID Name | Placement Surface | Placement Point [mm] | Placement Angle |
|---|---|---|---|
| IC1 | 1 | (10.0, 80.0) | 0.0 |
| IC2 | 1 | (70.0, 30.0) | −90.0 |
| IC3 | 4 | (32.0, 45.0) | 0.0 |
| ... | ... | ... | ... |

Foil Placement Information Table

| Foil ID Name | Net ID Name | Placement Surface | Form Type | Placement Point [mm] | Foil Width [mm] |
|---|---|---|---|---|---|
| ℓ1 | clk1 | 1 | line | (18.0, 80.0), (10.0, 80.0), (10.0, 55.0), (14.0, 55.0), (14.0, 50.0) | — |
| ℓ2 | clk1 | 2 | line | (14.0, 50.0), (56.0, 5.0) | — |
| ℓ3 | clk1 | 1 | line | (56.0, 50.0), (78.0, 50.0) | 0.15 |
| ... | ... | ... | ... | ... | ... |
| p1 | gnd1 | 3 | plane | (5.0, 5.0), (95.0, 5.0), (90.0, 95.0), (5.0, 95.0) | — |

Fig.13

Via Placement Information Table 470

| Via ID Name 471 | Net ID Name 472 | Placement Point [mm] 473 | First Placement Surface 474 | Second Placement Surface 475 | Hole Dia. [mm] 476 | Via Dia. [mm] 477 |
|---|---|---|---|---|---|---|
| v1 | clk1 | (20.0, 10.0) | 1 | 2 | 0.2 | 1.0 |
| v2 | clk1 | (130.0, 20.0) | 2 | 1 | 0.2 | 1.0 |
| ... | ... | ... | ... | ... | ... | ... |

Plane Clearance Information Table

| Target Element | Plane Clearance [mm] |
|---|---|
| Component Pad | 0.2 |
| Component | 2.0 |
| Inclusive Area | 2.0 |
| Offset Area | 2.0 |
| Wiring Foil | 0.2 |
| Via Pad | 2.0 |

Design Condition Violation Information Table 510

| ID Name 511 | Target Element 512 |
|---|---|
| IC3 | Inclusive Area |
| ℓ1 | Wiring Foil |
| v1 | Via Pad |
| ... | ... |

Plane Clearance Information Table

| Target Surface | 1, 2 | 1, 3 | 1, 4 | 3, 4 |
|---|---|---|---|---|
| Component Pad | 0.5 | 0.4 | 0.4 | 0.5 |
| Component | 2.5 | 2.0 | 2.0 | 2.5 |
| Inclusive Area | 2.5 | 2.0 | 2.0 | 2.5 |
| Offset Area | 2.0 | 1.5 | 1.5 | 2.0 |
| Wiring Foil | 0.5 | 0.4 | 0.4 | 0.5 |
| Via Pad | 2.5 | 2.0 | 2.0 | 2.5 |

(leftmost column label: Target Element)

Clearance Information Table

| [mm] | Wiring Foil | Component | Component Pad | Via Pad | Board Edge |
|---|---|---|---|---|---|
| Wiring Foil | 0.2 | 0.2 | 0.2 | 0.2 | 2.0 |
| Component | — | 0.2 | 0.2 | 0.2 | 5.0 |
| Component Pad | — | — | — | 0.2 | 5.0 |
| Via Pad | — | — | — | 0.2 | 2.0 |
| Board Edge | — | — | — | — | — |

WIRING BOARD DESIGN AIDING APPARATUS, DESIGN AIDING METHOD, STORAGE MEDIUM, AND COMPUTER PROGRAM

BACKGROUND OF THE INVENTION

1. Field of the Invention

The present invention relates generally to a design aiding apparatus, method, and computer program for aiding in a layout design of elements on a multilayer wiring board. In particular, the present invention relates to technology that aids in the placement of the elements on the wiring board so as to reduce noise.

2. Related Art

A prior art design aiding apparatus used in the layout design of elements such as components, wiring foils, and vias on a multilayer wiring board (i) stores various design criterion information that shows manufacturing restrictions relating to the processing of boards, the mounting of components, and the like, (ii) automatically determines the placement area of the various elements so as to comply with the design criterion information, and (iii) reports when the placement area of an element as indicated by a designer does not comply with the design criterion information.

The design criterion information includes such information as (i) the minimum distance allowable between wiring foils, components, component pads (i.e. the connection area between wiring foil and component), and via pads (i.e. the connection area between via and wiring foil), and (ii) the minimum distance allowable between the various wiring elements (i.e. wiring foils, components, component pads, via pads) and the edge of the board.

FIG. 27 shows an exemplary clearance information table 480 provided in the prior art design aiding apparatus to store information showing the minimum distances described above. Table 480 has a first classification row 481, a second classification column 482, and clearance value cells 483 that store values showing the spacing to be provided between the various elements given in row 481 and column 482.

In the prior art design aiding apparatus, the placement of wiring foils, components, component pads, and via pads is determined automatically by component placement processing and wiring processing so as satisfy the minimum distances stored in clearance information table 480.

The prior art design aiding apparatus also stores the minimum distances required between the various layers of the board (i.e. the power layer and the signal line layers provided above and below the power layer) in order to achieve a predetermined level of noise reduction, and wiring is conducted automatically in accordance with these stored minimum distances. The technology relating to the automatic wiring of multilayer wiring boards is disclosed in unexamined patent application publication 11-328235 "Pattern Automatic Wiring Method" filed in Japan.

Application of the prior art design aiding apparatus and the automatic wiring method serves to reduce the workload required of the designer in the layout design of components, foils and other elements on a multilayer wiring board, and as a result, reductions in design time and cost can be achieved.

However, research conducted in recent years into current flow in multilayer wiring boards has revealed a previously unknown cause of electromagnetic interference (EMI). It is now known that EMI is increased by current flowing through components, foils, and other elements whose placement area, as seen in a lamination direction of the board, overlaps with perimeter areas of the power plane and ground plane having a predetermined margin. This is particularly true of current that has a large high frequency component.

An effective means of reducing EMI caused by such current is to place the various elements so that, as seen in the lamination direction of the board, they are included within an area of the power and ground planes excluding a perimeter area having a predetermined margin.

This approach to reducing EMI is disclosed in Mark I. Montrose's *Printed Wiring Board Design Techniques for EMC Compliance*, IEEE Press, $2^{nd}$ ed.2000, (order no. PC5816).

However, the prior art design aiding apparatus and automatic wiring method do not include design criterion information or design aiding capabilities that allow for the placement area of elements to be determined such that the elements, as seen in the lamination direction of the board, are included within an area of the power and ground planes excluding a perimeter area.

In order to reduce the occurrence of EMI as described above, the designer is consequently required to manually determine the placement of the various elements, and as a result, the time and cost required in implementing layout design that takes account of the effects of EMI cannot be reduced.

SUMMARY OF THE INVENTION

In view of the issues discussed above, an object of the present invention is to provide a design aiding apparatus, method, and computer program for aiding in the layout design of elements such as components, wiring foils, and vias on a multilayer wiring board so as to reduce the occurrence of EMI.

(1) The stated object can be achieved by a design aiding apparatus that aids in a layout design of an element on a multilayer wiring board, the apparatus determining, when a placement area of a plane foil has been determined, a placement area of the element such that the element, as seen in a lamination direction of the board, is included within an area of the plane foil excluding a perimeter area.

According to this structure, the design aiding apparatus determines the placement area of elements, such as components, component pads, wiring foils, and vias, to be within an area of the power plane and ground plane excluding a perimeter area of these planes as seen in the lamination direction of the board, and as a result achieves layout design that effectively reduces EMI.

Consequently, the designer is no longer required to manually adjust the placement area of the various elements in order to reduce EMI, and as a result reductions can be achieved in the time and cost required in implementing layout design that takes account of EMI.

(2) Here, in regard to the apparatus described in section (1), a component and a pad, whose placement area is determined relative to a placement area of the component, may be included as elements, and the apparatus may include: a plane foil placement information storage unit for storing plane foil placement information showing a placement area of a plane foil whose placement area has been determined; a plane clearance information acquisition unit for acquiring plane clearance information showing one or more margins; and a component placement information generation unit for determining the placement area of the component such that at least one of the component and the pad, as seen in the lamination direction of the board, is included within a first candidate area of the plane foil excluding a perimeter area having a first margin shown in the plane clearance information, and for generating component placement information showing the determined placement area of the component.

According to this structure, the design aiding apparatus determines the placement area of at least one of the component and the component pads to be within an area of the power plane and ground plane excluding a perimeter area of these planes as seen in the lamination direction of the board, and as a result achieves the same effects as described in section (1).

(3) Here, the apparatus described in section (2) may further include a signal attribute information acquisition unit for acquiring signal attribute information showing an abruptness of a change over time of a signal transmitted from or received by the component, and the component placement information generation unit may include an abruptness judgment subunit for judging, based on the signal attribute information, whether the abruptness of the change over time of the signal satisfies a predetermined condition, and generate component placement information only when the abruptness judgment subunit judges in the affirmative.

According to this structure, the apparatus ensures that components handling high frequency signals (i.e. components particularly prone to EMI) are placed within an area of the power and ground planes excluding a perimeter area of these planes as seen in the lamination direction of the board. A prior art design aiding method may then be used in the layout design of other components less prone to EMI, such that these other components are placed in an area that includes the perimeter areas. As a result, the apparatus achieves layout design that both reduces the layout density of components and provides for effective EMI reduction.

(4) Here, in regard to the apparatus described in section (3), the signal attribute information may show at least one of a frequency, a rise time, and a fall time of the signal, and the abruptness judgment subunit may judge in the affirmative if the frequency of the signal is greater than or equal to a first threshold, or if at least one of the rise time and the fall time of the signal is less than or equal to a second threshold and a third threshold, respectively.

According to this structure, the same effects as described in section (3) can be achieved.

(5) Here, in regard to the apparatus described in section (2), an inclusive area may have been determined, with respect to the component, that includes the component and all pads whose placement area is determined relative to the placement area of the component, and the component placement information generation unit may determine the placement area of the component such that the inclusive area as seen in the lamination direction of the board, is included within a second candidate area of the plane foil excluding a perimeter area having a second margin shown in the plane clearance information, and generate component placement information showing the determined placement area of the component.

According to this structure, the same effects as described in section (2) can be achieved.

(6) Here, in regard to the apparatus described in section (2), the component placement information generation unit may determine, when plane foil placement information is not stored in the plane foil placement information storage unit, the placement area of the component such that at least one of the component and the pad, as seen in the lamination direction of the board, is included within an alternative candidate area of a surface of the board excluding a perimeter area having a predetermined margin, and generate component placement information showing the determined placement area of the component.

According to this structure, design procedure restrictions are mitigated as a result of the design aiding apparatus determining the placement area of components prior to the placement area of the power and ground planes being determined, by presupposing the largest possible area for the placement of the power and ground planes.

(7) Here, in regard to the apparatus described in section (1), a wiring foil and a via may be included as elements, and the apparatus may include: a plane foil placement information storage unit for storing plane foil placement information showing a placement area of a plane foil whose placement area has been determined; a plane clearance information acquisition unit for acquiring plane clearance information showing one or more margins; a wiring foil placement information generation unit for determining a placement area of the wiring foil such that the wiring foil, as seen in the lamination direction of the board, is included within a first candidate area of the plane foil excluding a perimeter area having a first margin shown in the plane clearance information, and for generating wiring foil placement information showing the determined placement area of the wiring foil; and a via placement information generation unit for determining a placement area of the via such that the via, as seen in the lamination direction of the board, is included within a second candidate area of the plane foil excluding a perimeter area having a second margin shown in the plane clearance information, and for generating via placement information showing the determined placement area of the via.

According to this structure, the design aiding apparatus determines the placement area of the wiring foil and via to be within an area of the power and ground planes excluding a perimeter area of these planes as seen in the lamination direction of the board, and as a result achieves the same effects as described in section (1).

(8) Here, the apparatus described in section (7) may further include: a first signal attribute information acquisition unit for acquiring first signal attribute information showing an abruptness of a change over time of a first signal transmitted by the wiring foil; and a second signal attribute information acquisition unit for acquiring second signal attribute information showing an abruptness of a change over time of a second signal transmitted by the via, the wiring foil placement information generation unit may include: a first abruptness judgment subunit for judging, based on the first signal attribute information, whether the abruptness of the change over time of the first signal satisfies a predetermined condition, and generate component placement information only if the first abruptness judgment subunit judges in the affirmative, and the via placement information generation unit may include: a second abruptness judgment subunit for judging, based on the second signal attribute information, whether the abruptness of the change over time of the second signal satisfies a predetermined condition, and generate component placement information only if the second abruptness judgment subunit judges in the affirmative.

According to this structure, the apparatus ensures that components handling high frequency signals (i.e. components particularly prone to EMI) are placed within an area of the power and ground planes excluding a perimeter area of these planes as seen in the lamination direction of the board.

A prior art design aiding method may then be used in the layout design of other components less prone to EMI, such that these other components are placed in an area that includes the perimeter areas. As a result, the apparatus achieves layout design that both reduces the layout density of components and provides for effective EMI reduction.

(9) Here, in regard to the apparatus described in section (8), the signal attribute information may show at least one of a frequency, a rise time, and a fall time of the first signal, and the first abruptness judgment subunit may judge in the affirmative if the frequency of the first signal is greater than or equal to a first threshold, or if at least one of the rise time and the fall time of the first signal is less than or equal to a second threshold and a third threshold, respectively, and the signal attribute information may show at least one of a frequency, a rise time, and a fall time of the second signal, and the second abruptness judgment subunit may judge in the affirmative if the frequency of the second signal is greater than or equal to the first threshold, or if at least one of the rise time and the fall time of the second signal is less than or equal to the second threshold and the third threshold, respectively.

According to this structure, the same effects as described in section (8) can be achieved.

(10) Here, in regard to the apparatus described in section (7), the wiring foil placement information generation unit may further include a wiring possibility judgment subunit for judging whether it is possible to determine the placement area of the wiring foil such that the wiring foil, as seen in the lamination direction of the board, is included within the first candidate area, the wiring foil placement information generation unit may determine, when the wiring possibility judgment subunit judges in the affirmative, the placement area of the wiring foil such that the wiring foil, as seen in the lamination direction of the board, is included within the first candidate area, and generate wiring foil placement information showing the determined placement area of the wiring foil, and the wiring foil placement information generation unit may determine, when the wiring possibility judgment subunit judges in the negative, the placement area of the wiring foil such that, as seen in the lamination direction of the board, an overlap between the placement area of the wiring foil and the perimeter area of the plane foil having the first margin is small enough to satisfy a predetermined condition, and generate wiring foil placement information showing the determined placement area of the wiring foil.

According to this structure, when the wiring foil cannot be placed within an area excluding the perimeter area of the power and ground planes as seen in the lamination direction of the board, the apparatus minimizes, as a next best option, the area of the wiring foil overlapping with the perimeter area, and as a result achieves layout design that reduces EMI.

(11) Here, in regard to the apparatus described in section (7), the wiring foil placement information generation unit may determine, when plane foil placement information is not stored in the plane foil placement information storage unit, the placement area of the wiring foil such that the wiring foil, as seen in the lamination direction of the board, is included within an alternative candidate area of a surface of the board excluding a perimeter area having a predetermined margin, and generate wiring foil placement information showing the determined placement area of the wiring foil, and the via placement information generation unit may determine, when plane foil placement information is not stored in the plane foil placement information storage unit, the placement area of the via such that the via, as seen in the lamination direction of the board, is included within the alternative candidate area, and generate via placement information showing the determined placement area of the via.

According to this structure, design procedure restrictions are mitigated as a result of the design aiding apparatus determining the placement area of components prior to the placement area of the power and ground planes being determined, by presupposing the largest possible area for the placement of the power and ground planes.

(12) Here, in regard to the apparatus described in section (7), a component and a pad, whose placement area is determined relative to a placement area of the component, can be further included as elements, and the apparatus may further include: a component placement information generation unit for determining the placement area of the component such that at least one of the component and the pad, as seen in the lamination direction of the board, is included within a third candidate area of the plane foil excluding a perimeter area having a third margin shown in the plane clearance information, and generating component placement information showing the determined placement area of the component.

According to this structure, the design aiding apparatus determines the placement area of not only wiring foils and vias but also components and component pads to be within an area of the power and ground planes excluding a perimeter area of these planes as seen in the lamination direction of the board, and as a result achieves the same effects as described in section (1).

(13) The stated object can also be achieved by a design aiding apparatus that aids in a layout design of an element on a multilayer wiring board, the apparatus reporting, when a placement area of the element and a plane foil have been determined, a design condition violation if the placement area of the element, as seen in a lamination direction of the board, deviates outside an area of the plane foil excluding a perimeter area.

According to this structure, the apparatus reports a design condition violation if the placement area of elements such as components, component pads, wiring foils, and vias deviates outside an area of the power and ground planes excluding a perimeter area as seen in the lamination direction of the board. Consequently, the designer is encouraged to make placement amendments, and as a result layout design that effectively reduces EMI can be achieved.

(14) Here, in regard to the apparatus described in section (13), a component, whose placement area may have been determined, and a pad, whose placement area is determined relative to the placement area of the component, may be included as elements, and the apparatus may include: a component placement information storage unit for storing component placement information showing the placement area of the component; a plane clearance information acquisition unit for acquiring plane clearance information showing one or more margins; a component deviation judgment unit for judging, when the component has been placed in accordance with the component placement information, whether the placement area of at least one of the component and the pad, as seen in the lamination direction of the board, deviates outside a first candidate area of the plane foil excluding a perimeter area having a first margin shown in the plane clearance information; and a design condition violation information generation unit for generating, when the component deviation judgment unit judges in the affirmative, component design condition violation information showing the component.

According to this structure, the apparatus reports a design condition violation if the placement area of at least one of the component and the component pads deviates outside an area of the power and ground planes excluding a perimeter area of these planes as seen in the lamination direction of the board. Consequently, the designer is encouraged to make placement amendments, and as a result layout design that effectively reduces EMI can be achieved.

(15) Here, the apparatus described in section (14) may further include: a signal attribute information acquisition unit for acquiring signal attribute information showing an abruptness of a change over time of a signal transmitted from or received by the component, and the design condition violation information generation unit may include: an abruptness judgment subunit for judging, based on the signal attribute information, whether the abruptness of the change over time of the signal satisfies a predetermined condition, and the design condition violation information generation unit may suppress the generation of the component design condition violation information when the abruptness judgment subunit judges in the negative.

According to this structure, the apparatus reports a design condition violation if the placement area of a component handling high frequency signals (i.e. a component particularly prone to EMI) deviates outside an area of the power and ground planes excluding a perimeter area as seen in the lamination direction of the board.

A prior art design aiding method may then be used to approve the placement of components less prone to EMI within an area that includes the perimeter areas. As a result, the apparatus achieves layout design that both reduces the layout density of components and provides for effective EMI reduction.

(16) Here, in regard to the apparatus described in section (14), an inclusive area may have been determined, with respect to the component, that includes the component and all pads whose placement area is determined relative to the placement area of the component, and the component deviation judgment unit may judge, when the component has been placed in accordance with the component placement information, whether the inclusive area, as seen in the lamination direction of the board, deviates outside a second candidate area of the plane foil excluding a perimeter area having a second margin shown in the plane clearance information.

According to this structure, the same effects as described in section (14) can be achieved.

(17) Here, in regard to the apparatus described in section (14), the component deviation judgment unit may judge, when plane foil placement information is not stored in the plane foil placement information storage unit, whether the placement area of at least one of the component and the pad, as seen in the lamination direction of the board, deviates outside an alternative candidate area of a surface of the board excluding a perimeter area having a predetermined margin.

According to this structure, design procedure restrictions are mitigated as a result of the design aiding apparatus reporting any deviation in a component placement that occurs prior to the placement area of the power and ground planes being determined, by presupposing the largest possible area for the placement of the power and ground planes.

(18) Here, in regard to the apparatus described in section (13), a wiring foil and a via may be included as elements, the placement areas of which have been determined, and the apparatus may include: a wiring foil placement information storage unit for storing wiring foil placement information showing a placement area of the wiring foil; a via placement information storage unit for storing via placement information showing a placement area of the via; a plane foil placement information storage unit for storing plane foil placement information showing a placement area of a plane foil whose placement area has been determined; a plane clearance information acquisition unit for acquiring plane clearance information showing one or more margins; a wiring foil deviation judgment unit for judging, when the wiring foil has been placed in accordance with the wiring foil placement information, whether the placement area of the wiring foil, as seen in the lamination direction of the board, deviates outside a first candidate area of the plane foil excluding a perimeter area having a first margin shown in the plane clearance information; a via deviation judgment unit for judging, when the via has been placed in accordance with the via placement information, whether the placement area of the via, as seen in the lamination direction of the board, deviates outside a second candidate area of the plane foil excluding a perimeter area having a second margin shown in the plane clearance information; and a design condition violation information generation unit for generating, when the wiring foil deviation judgment unit judges in the affirmative, wiring foil design condition violation information showing the wiring foil, and for generating, when the via deviation judgment unit judges in the affirmative, via design condition violation information showing the via.

According to this structure, the apparatus reports a design condition violation if the placement area of the wiring foil and via deviates outside an area of the power and ground planes excluding a perimeter area as seen in the lamination direction of the board, and as a result achieves layout design that effectively reduces EMI.

(19) Here, the apparatus described in section (18) may further include: a first signal attribute information acquisition unit for acquiring first signal attribute information showing an abruptness of a change over time of a first signal transmitted by the wiring foil; and a second signal attribute information acquisition unit for acquiring second signal attribute information showing an abruptness of a change over time of a second signal transmitted by the via, and the design condition violation information generation unit may include: a first abruptness judgment subunit for judging, based on the first signal attribute information, whether the abruptness of the change over time of the first signal satisfies a predetermined condition; and a second abruptness judgment subunit for judging, based on the second signal attribute information, whether the abruptness of the change over time of the second signal satisfies a predetermined condition, and the design condition violation information generation unit may suppress the generation of the wiring foil design condition violation information when the first abruptness judgment subunit judges in the negative, and suppress the generation of the via design condition violation information when the second abruptness judgment subunit judges in the negative.

According to this structure, the apparatus reports a design condition violation if the placement area of a component handling high frequency signals (i.e. a component particularly prone to EMI) deviates outside an area of the power and ground planes excluding a perimeter area as seen in the lamination direction of the board.

A prior art design aiding method may then be used to approve the placement of components less prone to EMI within an area that includes the perimeter areas. As a result, the apparatus achieves layout design that both reduces the layout density of components and provides for effective EMI reduction.

(20) Here, in regard to the apparatus described in section (18), the design condition violation information generation unit may suppress the generation of the wiring foil design condition violation information when the wiring foil deviation judgment unit judges in the affirmative, and when the placement area of the wiring foil is such that, as seen in the lamination direction of the board, an overlap between the placement area of the wiring foil and the perimeter area of the plane foil having the first margin is small enough to satisfy a predetermined condition.

According to this structure, the apparatus suppresses the reporting of a design condition violation with respect to a wiring foil whose placement area has been determined as a next best option when it was not possible to place the wiring foil within an area of the power and ground planes excluding a perimeter area as seen in the lamination direction of the board, and as a result achieves layout design that reduces EMI.

(21) Here, in regard to the apparatus described in section (18), the wiring foil deviation judgment unit may judge, when plane foil placement information is not stored in the plane foil placement information storage unit, whether the placement area of the wiring foil, as seen in the lamination direction of the board, deviates outside an alternative candidate area of a surface of the board excluding a perimeter area having a predetermined margin, and the via deviation judgment unit may judge, when plane foil placement information is not stored in the plane foil placement information storage unit, whether the placement area of the via, as seen in the lamination direction of the board, deviates outside an alternative candidate area of a surface of the board excluding a perimeter area having a predetermined margin.

According to this structure, design procedure restrictions are mitigated as a result of the design aiding apparatus reporting any deviation in a component placement that occurs prior to the placement area of the power and ground planes being determined, by presupposing the largest possible area for the placement of the power and ground planes.

(22) Here, in regard to the apparatus described in section (18), a component, whose placement area may have been determined, and a pad, whose placement area is determined relative to the placement area of the component, may be further included as elements, and the apparatus may further include: a component placement information storage unit for storing component placement information showing the placement area of the component; and a component deviation judgment unit for judging, when the component has been placed in accordance with the component placement information, whether the placement area of at least one of the component and the pad, as seen in the lamination direction of the board, deviates outside a third candidate area of the plane foil excluding a perimeter area having a third margin shown in the plane clearance information, and the design condition violation information generation unit may generate, when the component deviation judgment unit judges in the affirmative, component design condition violation information showing the component.

According to this structure, the apparatus encourages the designer to make amendments to the layout design by reporting a design condition violation if the placement area of not only the wiring foils and vias but also the components and component pads deviates outside an area of the power and ground planes excluding a perimeter area as seen in the lamination direction of the board, and as a result the apparatus achieves the same effects as described in section (13).

(23) The stated object can also be achieved by a design aiding method for aiding in a layout design of an element on a multilayer wiring board, the method including: a plane clearance information acquisition step of acquiring plane clearance information showing one or more margins; and a placement information generation step of determining, when a placement area of a plane foil has been determined, a placement area of the element such that the element, as seen in a lamination direction of the board, is included within a candidate area of the plane foil excluding a perimeter area having a margin shown in the plane clearance information, and of generating placement information showing the determined placement area of the element.

According to this structure, the same effects as described in section (1) can be achieved.

(24) The stated object can also be achieved by a design aiding method for aiding in a layout design of an element on a multilayer wiring board, the method including: a plane clearance information acquisition step of acquiring plane clearance information showing one or more margins; and a design condition violation information reporting step of reporting, when a placement area of the element and a plane foil has been determined, a design condition violation if the placement area of the element, as seen in a lamination direction of the board, deviates outside a candidate area of the plane foil excluding a perimeter area having a margin shown in the plane clearance information.

According to this structure, the same effects as described in section (13) can be achieved.

(25) The stated object can also be achieved by a computer program executed by a design aiding apparatus that aids in a layout design of an element on a multilayer wiring board, the computer program including: a plane clearance information acquisition step of acquiring plane clearance information showing one or more margins; and a placement information generation step of determining, when a placement area of a plane foil has been determined, a placement area of the element such that the element, as seen in a lamination direction of the board, is included within a candidate area of the plane foil excluding a perimeter area having a margin shown in the plane clearance information, and of generating placement information showing the determined placement area of the element.

According to this structure, the same effects as described in section (1) can be achieved.

(26) The stated object can also be achieved by a computer program executed by a design aiding apparatus that aids in a layout design of an element on a multilayer wiring board, the computer program including: a plane clearance information acquisition step of acquiring plane clearance information showing one or more margins; and a design condition violation information reporting step of reporting, when a placement area of the element and a plane foil has been determined, a design condition violation if the placement area of the element, as seen in a lamination direction of the board, deviates outside a candidate area of the plane foil excluding a perimeter area having a margin shown in the plane clearance information.

According to this structure, the same effects as described in section (13) can be achieved.

(27) The stated object can also be achieved by a computer-readable storage medium storing a computer program executed by a design aiding apparatus that aids in a layout design of an element on a multilayer wiring board, the computer program including: a plane clearance information acquisition step of acquiring plane clearance information showing one or more margins; and a placement information generation step of determining, when a placement area of a plane foil has been determined, a placement area of the element such that the element, as seen in a lamination direction of the board, is included within a candidate area of the plane foil excluding a perimeter area having a margin shown in the plane clearance information, and of generating placement information showing the determined placement area of the element.

According to this structure, the same effects as described in section (1) can be achieved.

(28) The stated object can also be achieved by a computer-readable storage medium storing a computer program executed by a design aiding apparatus that aids in a layout design of an element on a multilayer wiring board, the computer program including: a plane clearance information acquisition step of acquiring plane clearance information showing one or more margins; and a design condition violation information reporting step of reporting, when a placement area of the element and a plane foil has been determined, a design condition violation if the placement area of the element, as seen in a lamination direction of the board, deviates outside a candidate area of the plane foil excluding a perimeter area having a margin shown in the plane clearance information.

According to this structure, the same effects as described in section (13) can be achieved.

BRIEF DESCRIPTION OF THE DRAWINGS

These and other objects, advantages and features of the invention will become apparent from the following description thereof taken in conjunction with the accompanying drawings that illustrate specific embodiments of the present invention.

In the drawings:

FIG. 2 shows an exemplary command acquired by design aiding apparatus 1000;

FIG. 6 shows exemplary board information stored in board information table 400;

FIG. 7 shows exemplary component master information stored in component master information table 410;

FIG. 8 shows exemplary component form information stored in component form information table 420;

FIG. 9 shows exemplary component information stored in component information table 430;

FIG. 10 shows exemplary net information stored in net information table 440;

FIG. 11 shows exemplary component placement information stored in component placement information table 450;

FIG. 12 shows exemplary foil placement information stored in foil placement information table 460;

FIG. 13 shows exemplary via placement information stored in via placement information table 470;

FIG. 14 shows exemplary plane clearance information stored in plane clearance information table 490;

FIG. 16 shows exemplary design condition violation information stored in design condition violation information table 510;

FIG. 25 shows an exemplary plane clearance information table 520 storing plane clearance information specific to each wiring surface;

FIG. 27 shows exemplary clearance information stored in a clearance information table 480;

DETAILED DESCRIPTION OF THE PREFERRED EMBODIMENTS

A design aiding apparatus of the present invention is described below with reference to the drawings. The design aiding apparatus aids in a layout design of elements such as components, wiring foils, and vias on a multilayer wiring board so as to reduce the occurrence of EMI.

(1) When the placement area of a plane foil has been determined, the design aiding apparatus determines the placement areas of a component, a wiring foil, and a via such that the wiring foil, the via, and at least one of the component and component pads (i.e. pads connecting the component and the wiring foil) are included within a target placement area of the plane foil that is on a wiring surface of the multilayer wiring board other than the wiring surface on which the plane foil is placed, and which excludes, as seen in a lamination direction of the board, a perimeter area of the plane foil having a predetermined margin.

(2) Furthermore, with respect to a component, a wiring foil, and a via whose placement areas have been determined, the apparatus reports a design condition violation if the placement area of the wiring foil, the via, and at least one of the component and component pads deviates outside the target placement area.

Here, a "plane foil" is a conductive foil of a predetermined size that is placed as a sheet on a wiring surface of the board, and is to be distinguished from a "wiring foil" which is a conductive foil placed as a line on a wiring surface of the board.

Structure of the Design Aiding Apparatus

Figure 1:
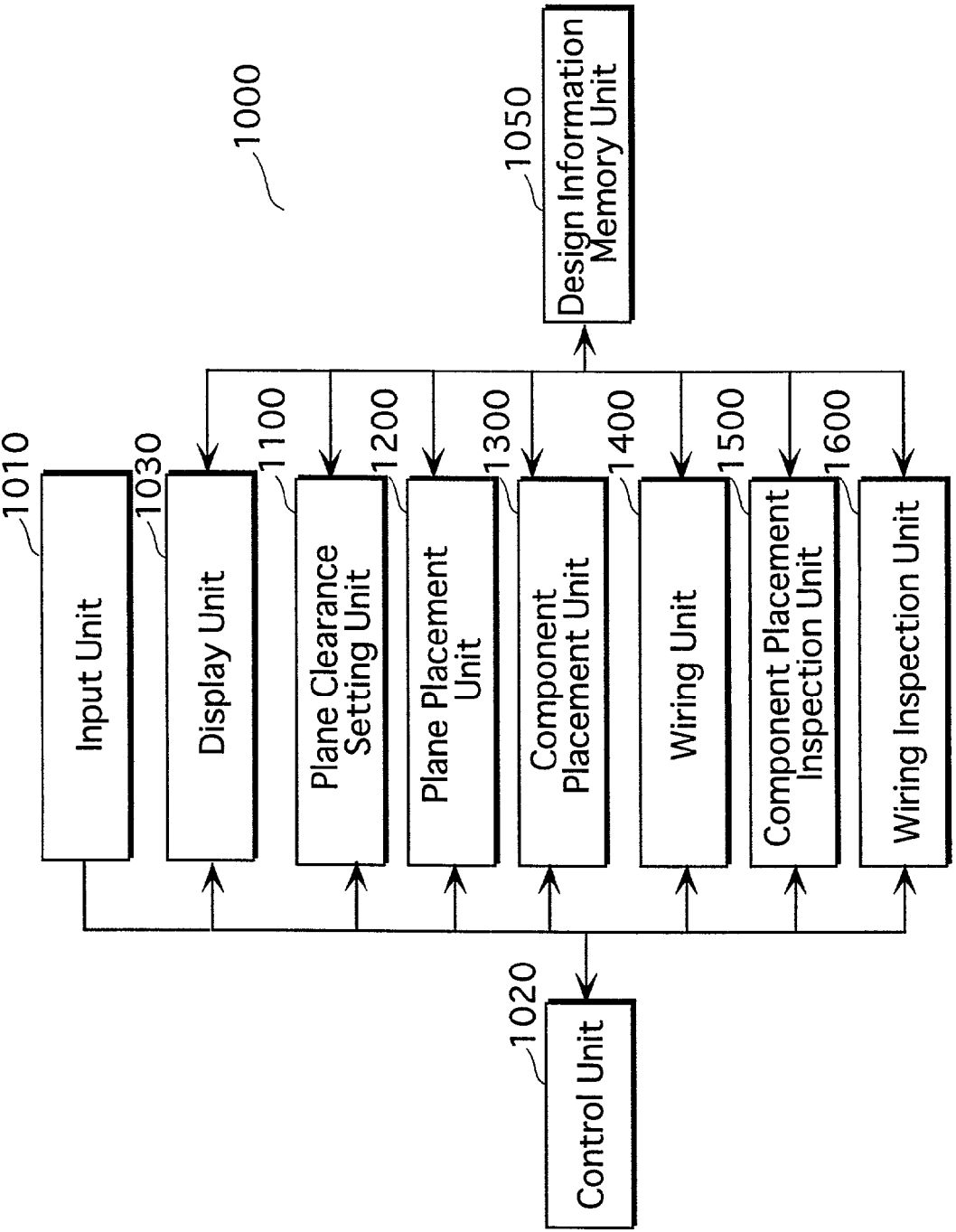
FIG. 1 is a functional block diagram showing an overall structure of a design aiding apparatus 1000 according to an embodiment of the present invention.

FIG. 1 is a functional block diagram showing an overall structure of a design aiding apparatus 1000 according to an embodiment of the present invention. Design aiding apparatus 1000 includes an input unit 1010, a control unit 1020, a display unit 1030, a design information access unit 1040, a design information memory unit 1050, a plane clearance setting unit 1100, a plane placement unit 1200, a component placement unit 1300, a wiring unit 1400, a component placement inspection unit 1500, and a wiring inspection unit 1600.

Specifically, design aiding apparatus 1000 is realized by hardware such as a processor, a read only memory (ROM) storing a computer program, a working random access memory (RAM), and a hard disk device. The functions of apparatus 1000 described above are realized by the processor executing the computer program stored in the ROM. Transfer of information around the elements of apparatus 1000 is conducted via the RAM and the hard disk device.

Input Unit 1010

Unit 1010 acquires, from an external source, command information showing operating instructions pertaining to design aiding apparatus 1000, and outputs the acquired information to control unit 1020.

FIG. 2 shows exemplary command information 200 acquired by unit 1010. Command information 200 includes a command classification column 201 showing the various processing performed in design aiding apparatus 1000, and a parameter column 202 showing the detailed objects of the processing. A full description of examples 203 to 210 will be given in a later section.

Control Unit 1020

Unit 1020 acquires the command information from input unit 1010, and in accordance with the command classification included in the acquired command information, instructs one of units 1100, 1200, 1300, 1400, 1500, and 1600 to execute processing. Unit 1020 then transfers the parameters included in the command information to the unit instructed to execute processing.

Display Unit 1030

On receipt of a processing instruction from control unit 1020, unit 1030 displays the placement status of components, wiring foils, and vias based on design information stored in design information storage unit 1050.

Figure 3:
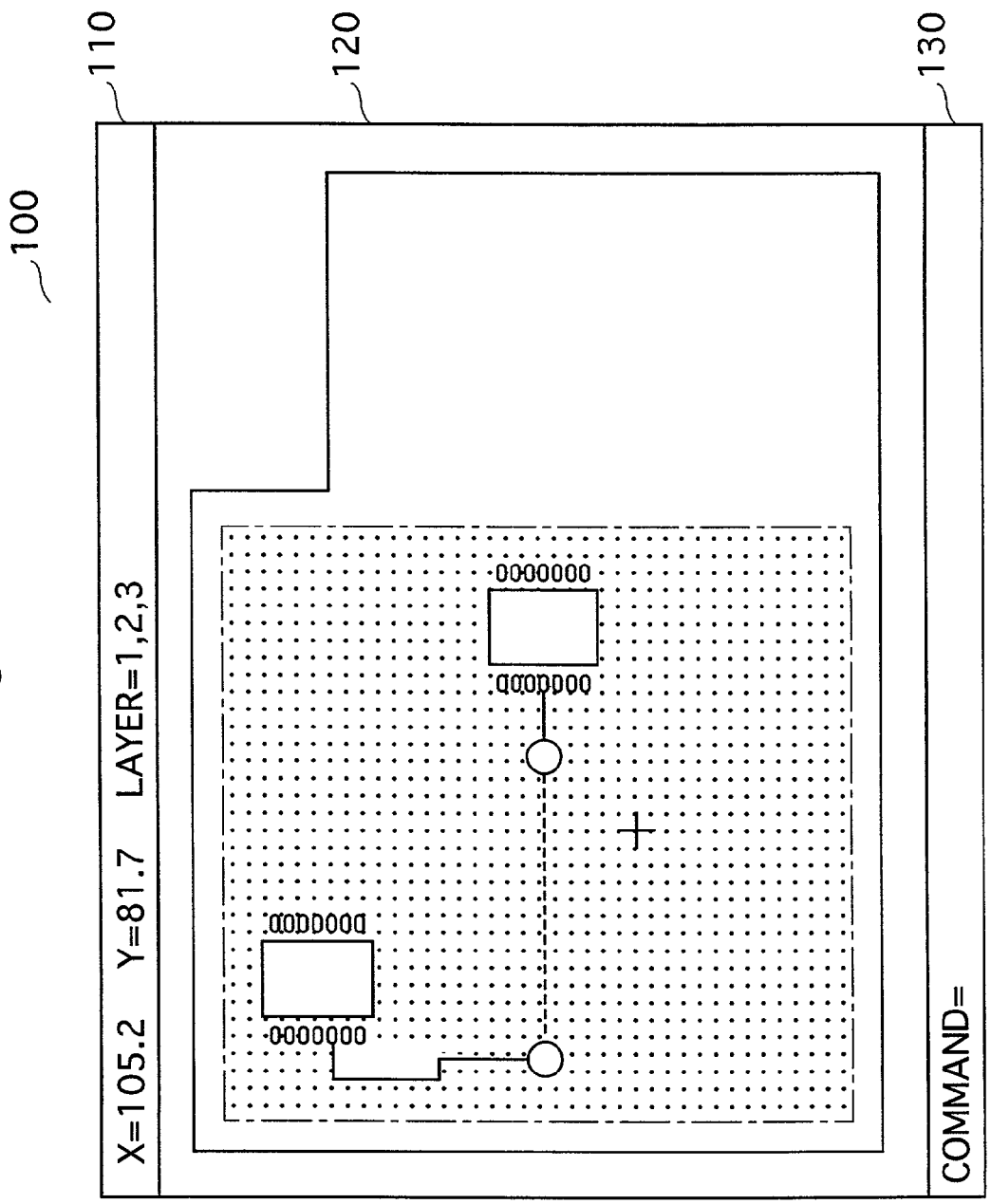
FIG. 3 shows an exemplary content displayed on a display unit.

FIG. 3 shows an exemplary display 100 executed by unit 1030.

In display area 120, the placement status of the components, pads, wiring foils, vias, and the plane are shown from above as seen in the lamination direction of the wiring board. The two white rectangles in display area 120 are components, the plurality of oval shapes depicted on either side of the components are pads connecting the components with the wiring foils, the two white circles are vias, the two lines are wiring foils connecting the vias and the pads, and the gray rectangle is the plane. The different shapes are displayed using various colors, degrees of brightness, line forms, and the like, so as to identify the different wiring surfaces on which the components, pads, wiring foils, vias, and planes are situated. Also displayed in display area 120 is a cursor that is controlled by a pointing device. The cross mark in display area 120 represents the cursor.

Display area 110 shows the XY coordinates of the center point of the cursor as well as numbers representing the wiring surfaces being displayed.

For the purpose of confirmation, display area 130 shows the command acquired by input unit 1010.

Placement Target Elements

The planes, components, pads, wiring foils, and vias targeted for layout design using design aiding apparatus 1000 will now be described with reference to FIGS. 4 and 5. In addition, the method of indicating the placement area of a placement target element will also be described.

Figure 4:
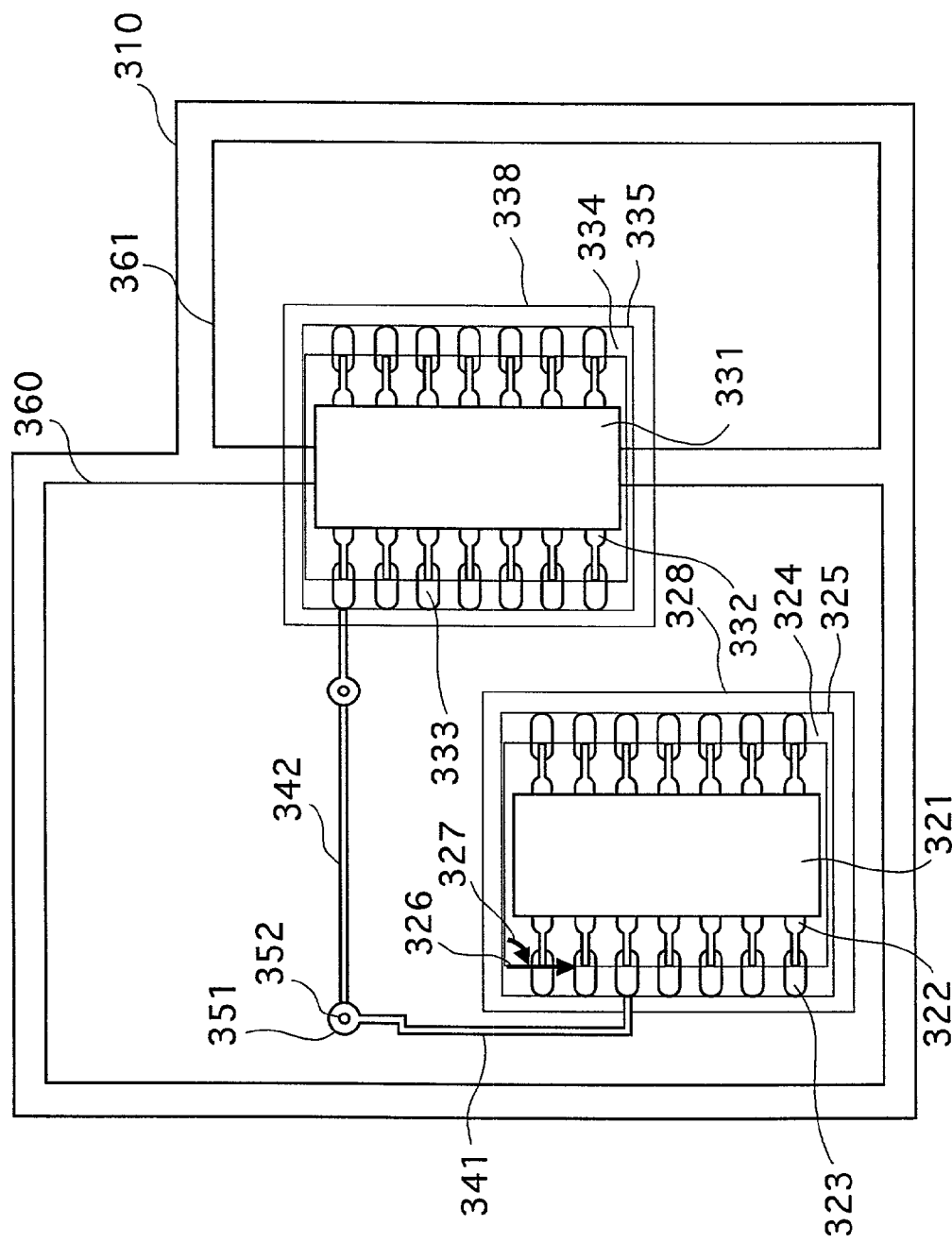
FIG. 4 is a top down view of planes, components, pads, wiring foils, and vias as seen in a lamination direction of a wiring board.

FIG. 4 is a top down view of the planes, components, pads, wiring foils, and vias as seen in the lamination direction of the board. FIG. 5 is a side view of the elements shown in FIG. 4.

Wiring Board

Figure 5:
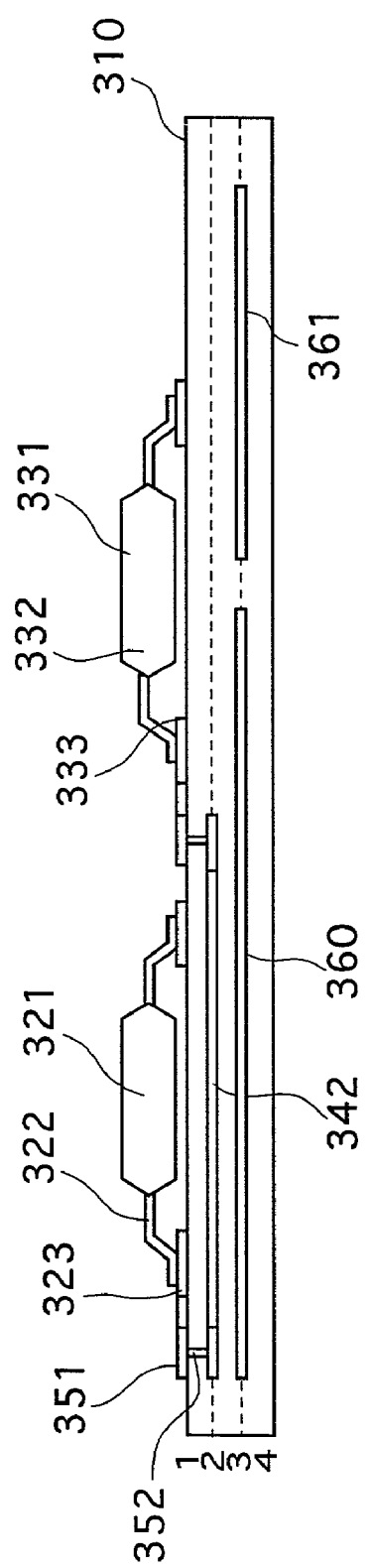
FIG. 5 is a side view of the elements shown in FIG. 4.

A wiring board 310 given as an example in FIGS. 4 and 5 is a multilayer wiring board having four wiring surfaces. In FIG. 5 the position and ID numbering of the wiring surfaces is indicated by the broken lines and the numbers to the left of the broken lines.

Design aiding apparatus 1000 shows the placement area of the placement target elements using a three dimensional orthogonal coordinate system, where the wiring surfaces of the wiring board correspond to the XY plane and the lamination direction of the board is in a Z direction.

Plane

In FIGS. 4 and 5, 360 and 361 are exemplary planes. Planes 360 and 361 are placed respectively in sheet-form in the rectangular areas shown in FIG. 4 on the third wiring surface.

In apparatus 1000, the placement area of the planes is indicated by the number of the wiring surface as well as the XY coordinates of the vertices of the respective placement areas. Apparatus 1000 recognizes an area (not marked in the drawings) of each plane excluding a perimeter area having a predetermined margin as candidate areas for placement.

Component

Each component includes one or more pins. Each pin is connected to a pad on either the front or back surfaces of the wiring board. Here, a pad connected to a component is referred to as a "component pad". Each component pad is a section of the conductive foil laid over at least one of the front and back surfaces of the wiring board. Apparatus 1000 manages each component pad jointly with the component to which it is connected.

Referring to FIG. 4, in apparatus 1000 each component is broken down into four areas.

1) a component pad area: the area of the pads connected to the component
2) a main body area: the smallest rectangular area containing the component
3) an inclusive area: the smallest rectangular area containing the component and the component pads
4) an offset area: an area larger than the inclusive area by a predetermined margin and which is provided so as to enable wiring to be routed without interference from adjacent components In FIGS. 4 and 5, 321 and 331 are components, 322 and 332 are pins, 323 and 333 are component pads, 324 and 334 are main body areas, 325 and 335 are inclusive areas, and 328 and 338 are offset areas.

The determined placement area of a component is indicated in apparatus 1000 as follows:

1) A reference point is determined that is fixed in relation to the main body of the component.
2) A reference direction is determined that is also fixed in relation to the main body of the component.
3) A placement surface (i.e. the front or back surface of the wiring board), a placement point (i.e. an XY coordinate on the selected placement surface), and a placement angle (i.e. the angle between the X axis and the reference direction of the component placed such that the reference point is aligned with the XY coordinate of the placement point) are then specified.

The placement area of a component on a wiring board is indicated as described above. In FIG. 4, 326 marks the reference point and reference direction of component 321, and 327 marks the placement angle.

Via

A via is a conductor placed so as to pass through an insulator that lies between any two wiring surfaces. Both ends of the via connect with pads positioned on the wiring surfaces. Here, a pad connected to a via is referred to as a "via pad". The via either fills a thru-hole provided between the two wiring surfaces or is applied/plated to the inner surface of the thru-hole. A via pad is a wiring foil laid on a wiring surface so as to be concentric with the thru-hole. Apparatus 1000 manages each via pad jointly with the via to which it is connected.

In FIGS. 4 and 5, 351 is a via pad connected to a via and 352 is a thru-hole in which the via is placed.

In design aiding apparatus 1000, the placement area of a via is indicated by the number of the wiring surfaces (i.e. 1, 2, 3, 4) on which both ends of the via are positioned, the XY coordinates of the center of the thru-hole, and the diameter of the via pads to which the via is connected.

Wiring Foil

A wiring foil is a conductive foil laid in a placement area having a certain width on the wiring surface on which it is placed. Each wiring foil is connected collectively to a component pad, a via pad, and a plane.

In FIG. 4, 341 and 342 are wiring foils (only wiring foil 342 is shown in FIG. 5).

In apparatus 1000, the placement area of a wiring foil is indicated by the width of the placement area, the XY coordinates of both ends of the wiring foil, and the XY coordinates of any points through which the wiring foil passes.

Design Information Unit 1040

Unit 1040 receives predetermined design information from units 1100, 1200, 1300, and 1400, and stores the received design information in design information memory unit 1050. Furthermore, on receipt of a request for design information from any of units 1030, 1100, 1200, 1300, 1400, 1500, and 1600, design information unit 1040 acquires the requested design information from design information memory unit 1050 and transfers the acquired design information to the unit that sent the request.

Design Information Memory Unit 1050

Unit 1050 includes the tables described below, and stores predetermined design information in the tables. The tables included in unit 1050 as well as the design information they store will now be described in detail.

Board Information Table 400

FIG. 6 shows exemplary board information stored in table 400. Table 400 has a structural points column 401 and a column 402 showing the number of wiring surfaces.

Column 401 stores the XY coordinates of the vertices of the wiring board, and column 402 stores the total number of wiring surfaces included in the board.

The board information stored in table 400 is provided in advance to apparatus 1000 from an external circuit design aiding apparatus, a design information maintenance apparatus, or the like.

Component Master Information Table 410

FIG. 7 shows exemplary component master information stored in table 410.

Table 410 has an ID name column 411, a type column 412, a column 413 showing the number of pins, and a form column 414.

Column 411 stores names identifying the components. Column 412 stores symbols indicating the various component types (eg. IC, capacitor). Column 413 stores the total number of pins included in each component. Column 414 stores information identifying the various forms of the components.

The component master information stored in table 410 is provided in advance to apparatus 1000 from an external circuit design aiding apparatus, a design information maintenance apparatus, or the like.

Component Form Information Table 420

FIG. 8 shows exemplary component form information stored in table 420. Table 420 has a form column 421, a main body area column 422, a pin number column 423, a component pad area column 424, an inclusive area column 425, and an offset area column 426.

Column 421 stores information showing the various forms of the components. Column 422 stores the XY coordinates of the opposite angles of the main body area of components placed such that the reference point is aligned with the XY coordinate of the origin and the reference direction is aligned with the X axis (hereafter, this placement method is referred to as "reference placement"). Column 423 stores numbers identifying each of the pins included in the components. Column 424 stores the XY coordinates of the opposite angles of the component pad area of component pads connected to the pins of components that have been placed in accordance with reference placement. Column 425 stores the XY coordinates of the opposite angles of the inclusive area of the components. Column 426 stores the XY coordinates of the opposite angles of the offset area of the scomponents.

The component form information stored in table 420 is provided in advance to apparatus 1000 from an external circuit design aiding apparatus, a design information maintenance apparatus, or the like.

Component Information Table 430

FIG. 9 shows exemplary component information stored in table 430.

Table 430 has an ID name column 431, a classification column 432, a component pad clearance column 433, a component clearance value column 434, an inclusive area clearance column 435, and an offset area clearance column 436.

Column 431 stores names identifying the components. Column 432 stores names identifying the various classifications of the components. Columns 433, 434, 435, and 436 store the allowable margins between the edge of the plane and the component pad area, the main body area, the inclusive area, and the offset area, respectively, when these margins have been regulated for each component.

The component information stored in table 430 is provided in advance to apparatus 1000 from an external circuit design aiding apparatus, a design information maintenance apparatus, or the like.

Net Information Table 440

FIG. 10 shows exemplary net information stored in table 440.

Table 440 has a net ID name column 441, a pin ID column 442, a frequency column 443, a rise time column 444, a fall time column 445, a type column 446, a wiring foil clearance column 447, a via pad clearance column 448, and a foil width column 449.

Column 441 stores names identifying the nets. Column 442 stores names identifying the pins included in components belonging to the nets. Columns 443, 444, and 445 store respectively the maximum value of the frequencies, and the minimum value of the rise times and fall times when these values have been regulated with respect to the signals flowing through the nets. Column 446 stores names identifying the type of signals flowing through the nets (eg. clock signal, general signal, ground signal). Columns 447 and 448 store respectively the allowable margins between the edge of a plane and the wiring foils and via pads belonging to the net when these margins have been regulated with respect to each net. Column 449 stores the width of wiring foils belonging to the nets.

The net information stored in table 440 is provided in advance to apparatus 1000 from an external circuit design aiding apparatus, a design information maintenance apparatus, or the like.

Component Placement Information Table 450

FIG. 11 shows exemplary component placement information stored in table 450.

Table 450 has an ID name column 451, a placement surface column 452, a placement point column 453, and a placement angle column 454.

Column 451 stores names identifying the components. Column 452 stores numbers showing the wiring surface on which the components are placed. Column 453 stores XY coordinates showing the position with which the reference point of components is to be aligned. Column 454 stores the angle between the X axis and the reference direction of the components.

The component placement information stored in table 450 is generated by component placement unit 1300 and transferred to design information storage unit 1050 via design information access unit 1040.

Foil Placement Information Table 460

FIG. 12 shows exemplary foil placement information stored in table 460.

Table 460 has a foil ID name column 461, a net ID name column 462, a placement surface column 463, a form type column 464, a placement point column 465, and a foil width column 466.

Column 461 stores names identifying the wiring foils or planes. Column 462 stores names identifying the net to which the wiring foils or planes belongs. Column 463 stores numbers showing the wiring surface on which wiring foils or planes are placed. Column 464 stores names indicating whether the foil is a wiring foil or a plane. Column 465 stores either the XY coordinates of both ends of the wiring foils and any points through which the wiring foils pass, or the XY coordinates of the vertices of the placement area of the planes. Column 466 stores the width of the wiring foils when the width is regulated with respect to each wiring foil.

The foil placement information stored in table 460 is generated by plane placement unit 1200 and wiring unit 1400.

So as to distinguish foil placement information showing the placement of wiring foils from foil placement information showing the placement of planes, the former may alternatively be referred to as "routing information".

Via Placement Information Table 470

FIG. 13 shows exemplary via placement information stored in table 470.

Table 470 has a via ID name column 471, a net ID name column 472, a placement point column 473, a first placement surface column 474, a second placement surface column 475, a hole diameter column 476, and a via diameter column 477.

Column 471 stores names identifying the vias. Column 472 stores names identifying the net to which the vias belong. Column 473 stores the XY coordinate of the central position of the vias. Columns 474 and 475 store the number of the wiring surfaces on which both ends of the vias are placed. Column 476 stores the diameter of the thru-holes through which the vias are mounted. Column 477 stores the diameter of the pads to which the vias are connected.

The foil placement information stored in table 470 is generated by wiring unit 1400.

Plane Clearance Information Table 490

FIG. 14 shows exemplary plane clearance information stored in table 490.

Table 490 has a target element column 491 and a plane clearance column 492.

Column 491 stores names showing target elements and areas. Column 492 stores the allowable margins between each of the target elements shown in column 491 and the edge of the plane. Cells 493 to 498 store, respectively, a component pad clearance value, a component pad clearance value, a component clearance value, an inclusive area clearance value, an offset area clearance value, a wiring foil clearance value, and a via pad clearance value.

These values apply to all components and nets except those shown in component information table 430 and net information table 440 whose clearance value is regulated individually.

The plane clearance information stored in table 490 is generated by plane clearance setting unit 1100.

Figure 15:
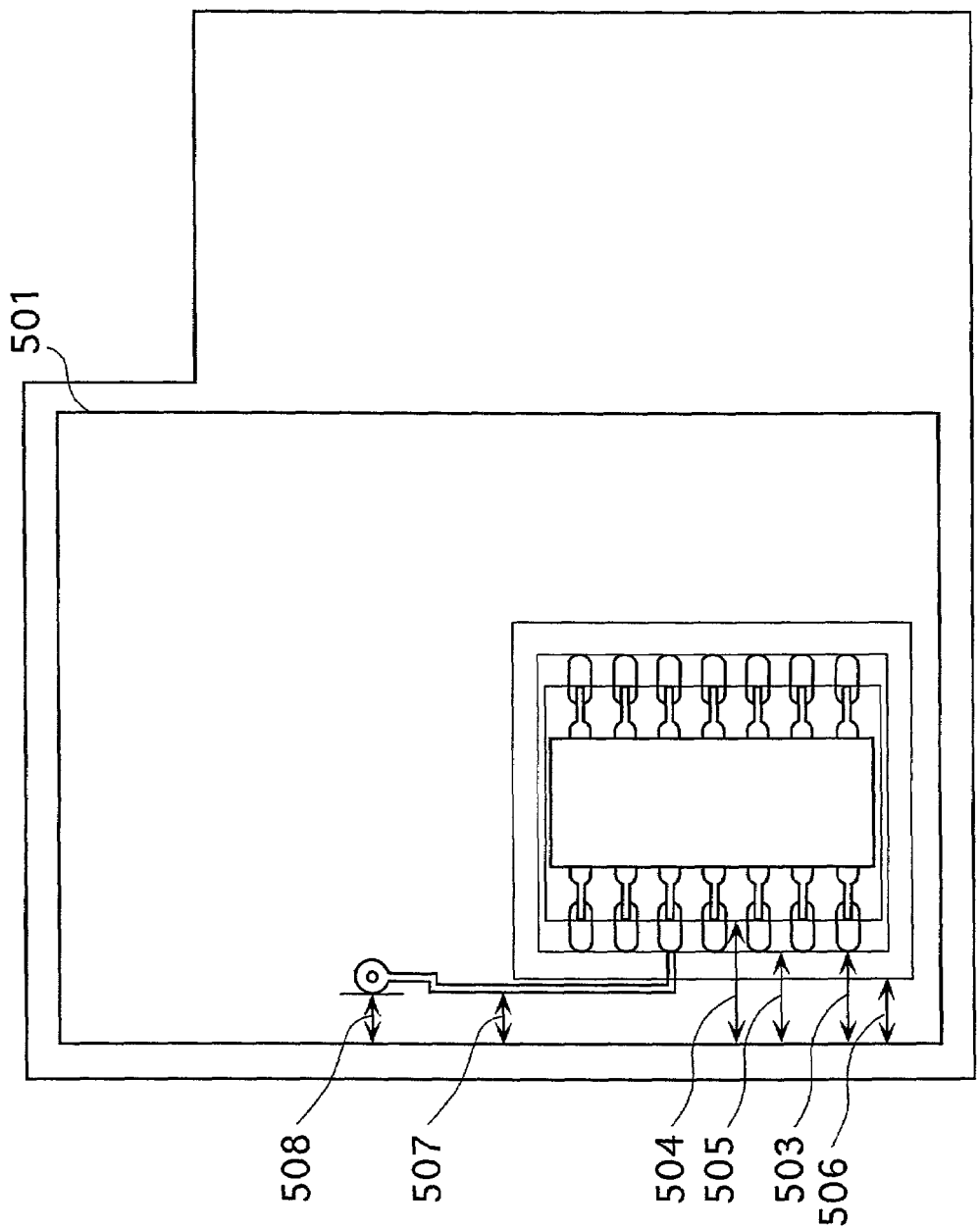
FIG. 15 is a top down view of margins shown in the plane clearance information.

FIG. 15 is a top down view of the margins shown in the plane clearance information.

In FIG. 15, 501 is a plane, and 503 to 508 are, respectively, the component pad clearance value, the component clearance value, the inclusive area clearance value, the offset area clearance value, the wiring foil clearance value, and the via pad clearance value.

Design Condition Violation Information Table 510

FIG. 16 shows exemplary design condition violation information stored in table 510.

Table 510 has an ID name column 511 and a target element column 512.

Column 511 stores names identifying components, wiring foils, and vias. Column 512 stores names showing target elements and areas that do not comply with respective plane clearance values.

The design condition violation information stored in table 510 is generated by component placement inspection unit 1500 and wiring inspection unit 1600.

Processing Conducted by Design Aiding Apparatus 1000

The processing conducted by apparatus 1000 will now be described with reference to the flowcharts.

Figure 17:
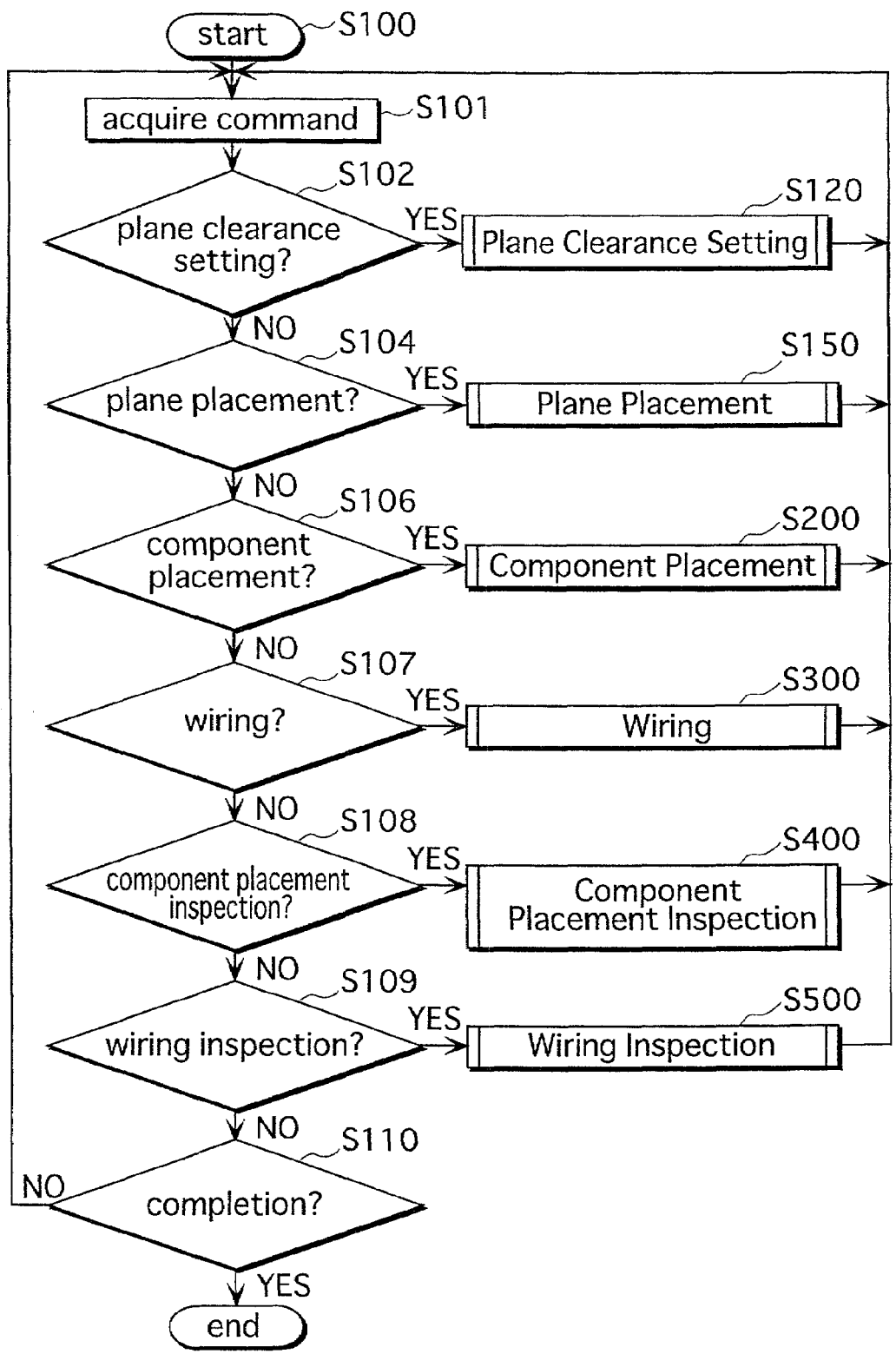
FIG. 17 is a flowchart of a main routine of the processing conducted by design aiding apparatus 1000.

FIG. 17 is a flowchart of a main routine of the processing conducted by design aiding apparatus 1000.

Step S101: Input unit 1010 acquires command information from an external source and transfers the acquired information to control unit 1020.

Step S102: Control unit 1020 analyses the transferred command information, and if the information shows a plane clearance setting command, control unit 1020 proceeds to step s120.

Step S104: Alternatively, if the information shows a plane placement command, control unit 1020 proceeds to step s150.

Step S106: Alternatively, if the information shows a component placement command, control unit 1020 proceeds to step s200.

Step S107: Alternatively, if the information shows a wiring command, control unit 1020 proceeds to step s300.

Step S108: Alternatively, if the information shows a component placement inspection command, control unit 1020 proceeds to step s400.

Step S109: Alternatively, if the information shows a wiring inspection command, control unit 1020 proceeds to step s500.

Step S110: Alternatively, if the information shows a completion command, control unit 1020 returns to step s101 and repeats the processing.

Step S120: Plane clearance unit 1100 conducts plane clearance setting processing.

Step S150: Plane placement unit 1200 conducts plane placement processing.

Step S200: Component placement unit 1300 conducts component placement processing.

Step S300: Wiring unit 1400 conducts wiring processing.

Step S400: Component placement inspection unit 1500 conducts component placement inspection processing.

Step S500: Wiring inspection unit 1600 conducts wiring inspection processing.

Step S600: Display unit 1030 displays the most up-to-date placement status of the planes, components, wiring foils, and vias shown by the design information stored in design information storage unit 1050 in steps s120 through s500.

Display unit 1030 displays the components, wiring foils, and vias shown in the design condition violation information stored in table 510 (FIG. 16) with bright/flashing illumination or specified colors so as to notify the designer of a design condition violation. This display is conducted especially after the completion of the component placement inspection processing and the wiring inspection processing as a result of which the design condition violation information is stored in table 510.

The subroutines of each of the above processing operations will now be described.

Plane Clearance Setting Processing

Plane clearance setting unit 1100 is mobilized by control unit 1020 when the information acquired by input unit 1010 shows a plane clearance setting command. In this case, unit 1100 receives from control unit 1020 the parameters included in the command information, and executes the plane clearance setting processing based on the received parameters.

In FIG. 2, cells 203 to 205 show, respectively, exemplary formations 1, 2, and 3 of the parameters transferred to plane clearance unit 1100 by control unit 1020.

The formation 1 parameters include in the stated order, a component pad clearance value, a component clearance value, an inclusive area clearance value, an offset area clearance value, a wiring foil clearance value, and a via pad clearance value. These parameters show a predetermined clearance value allowable between the edge of a plane and, respectively, the component pads, main body of the component, inclusive area, offset area, wiring foils, and via pads.

The formation 2 parameters include in the stated order, a component ID name, a component pad clearance value, a component clearance value, an inclusive area clearance value, and an offset area clearance value. These parameters are used for the component identified by the component ID name when the values specified in formation 2 differ from those in formation 1.

The formation 3 parameters include in the stated order, a net ID name, a wiring foil clearance value, and a via pad clearance value. These parameters are used for the wiring foils and vias belonging to the net identified by the net ID name when the values specified in formation 3 differ from those in formation 1.

Figure 18:
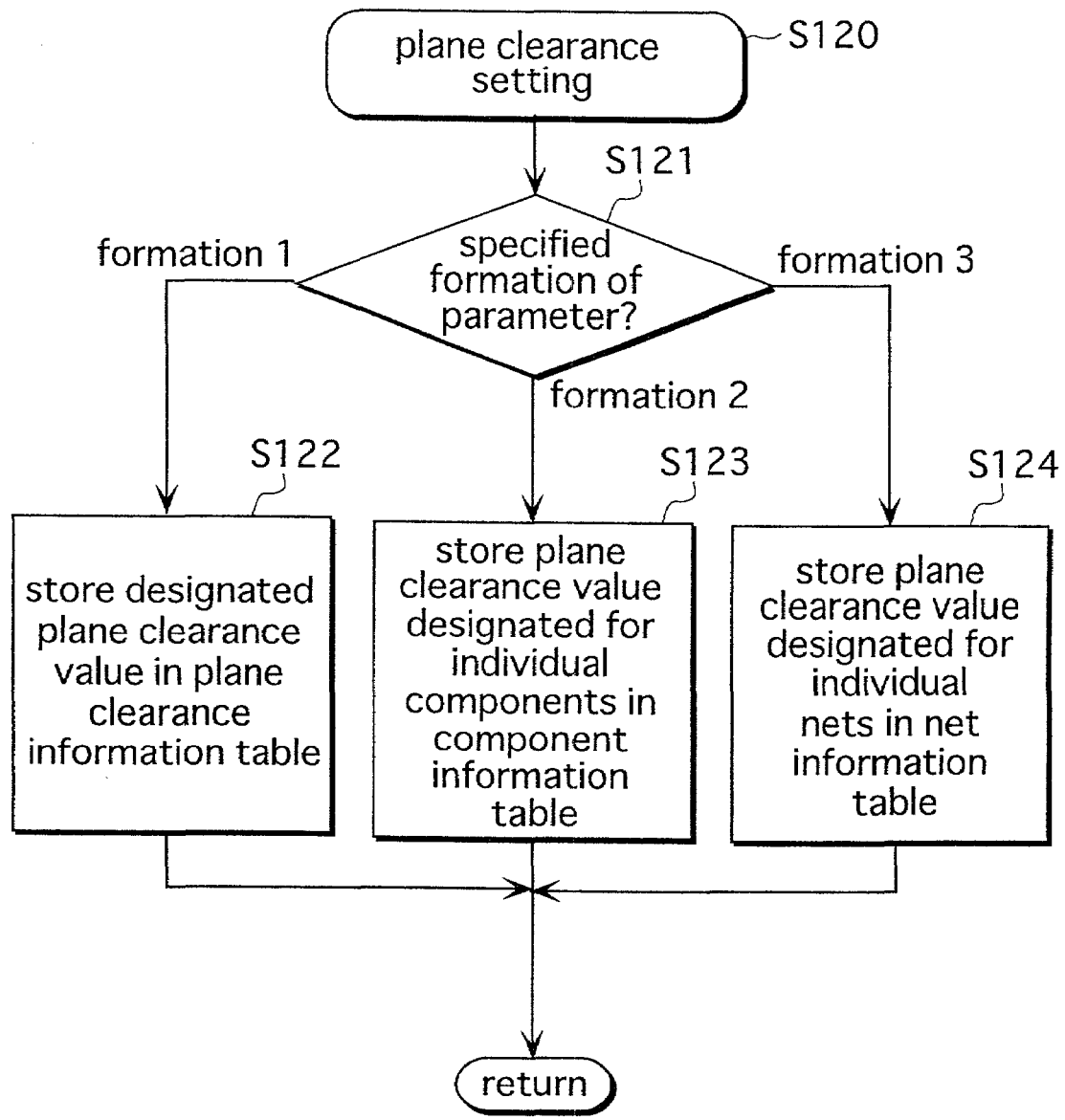
FIG. 18 is a flowchart of a plane clearance processing subroutine.

FIG. 18 is a flowchart of the plane clearance setting processing subroutine.

Step S121: Plane clearance setting unit 1100 proceeds to either of steps s122, s123, or s124 depending on the specified formation of the parameters.

Step S122: When the formation 1 parameters are specified, plane clearance setting unit 1100 stores the clearance values included in the formation 1 parameters in the respective rows of plane clearance information table 490 (FIG. 14).

Step S123: When the formation 2 parameters are specified, unit 1100 stores, in component information table 430 (FIG. 9), the clearance values included in the formation 2 parameters in the respective columns of the row of table 430 corresponding to the component ID name specified in the parameters.

Step S124: When the formation 3 parameters are specified, unit 1100 stores, in net information table 440 (FIG. 10), the clearance values included in the formation 3 parameters in the respective columns of the row of table 440 corresponding to net ID name specified in the parameters.

Plane Placement Processing

Plane placement unit 1200 is mobilized by control unit 1020 when the information acquired by input unit 1010 shows a plane placement command. In this case, unit 1200 receives from control unit 1020 the parameters included in the command information, and executes the plane placement processing based on the received parameters.

In FIG. 2, cell 206 shows exemplary parameters transferred to plane placement unit 1200 by control unit 1020. The transferred parameters include in the stated order, a foil ID name, a net ID name, a wiring surface number, and coordinates marking the vertices of the area of the plane.

Figure 19:
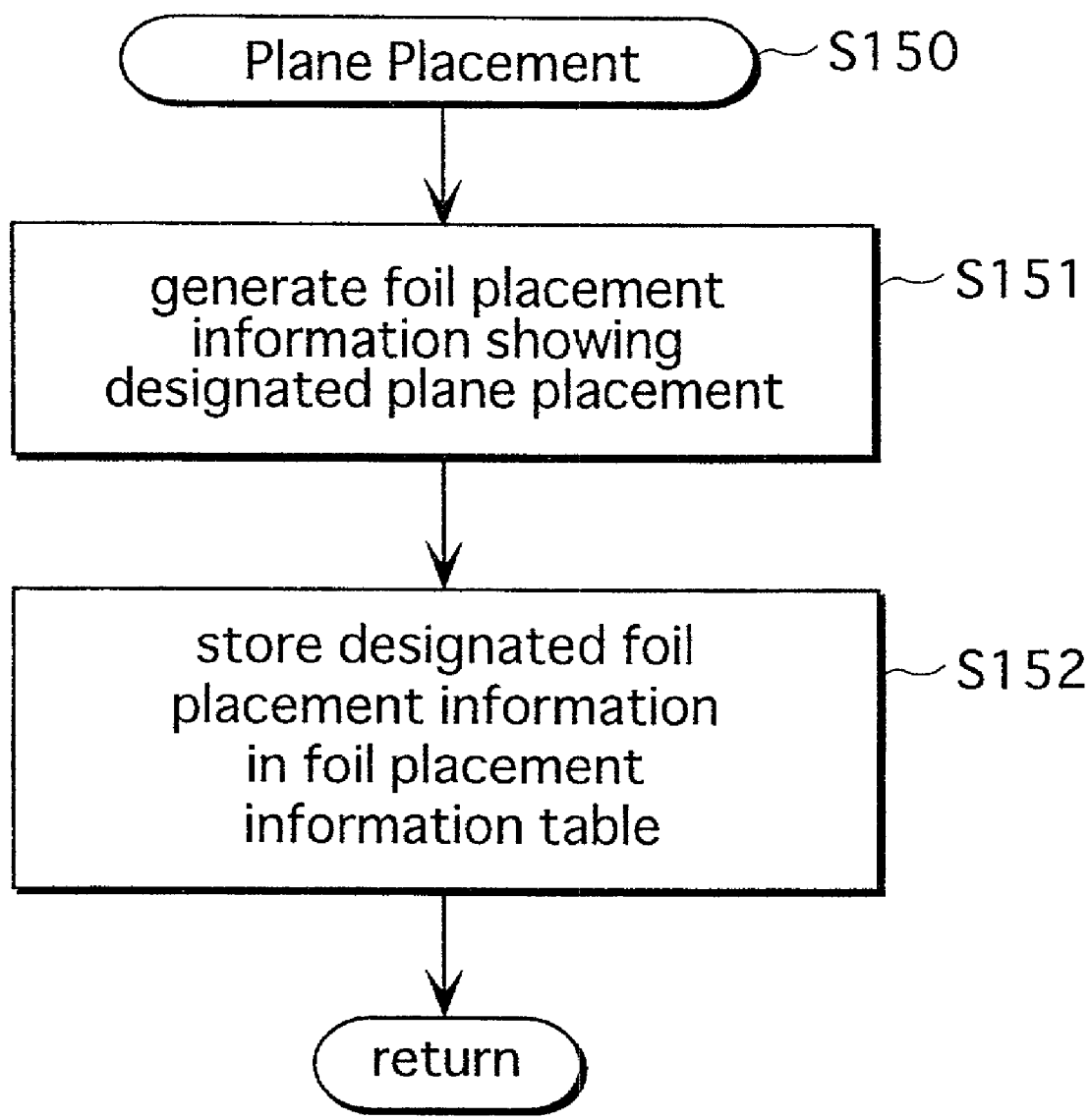
FIG. 19 is a flowchart of a plane placement processing subroutine.

FIG. 19 is a flowchart of the plane placement processing subroutine.

Step S151: Plane placement unit 1200 generates foil placement information showing the form of the plane, and in which is included the foil ID name, net ID name, wiring surface, and placement points specified in the parameters.

Step S152: Unit 1200 stores the generated foil placement information in table 460 (FIG. 12) via design information access unit 1040.

Component Placement Processing

Component placement unit 1300 is mobilized by control unit 1020 when the information acquired by input unit 1010 shows a component placement command. In this case, unit 1300 receives from control unit 1020 the parameters included in the command information, and executes the component placement processing based on the received parameters.

In FIG. 2, cell 207 shows exemplary parameters transferred to component placement unit 1300 by control unit 1020. The transferred parameters include in the stated order, an area type and one or more component ID names. The area type of the component pad area, the main body area, the inclusive area, and the offset area is specified using the numbers 1, 2, 3, and 4, respectively.

Figure 20:
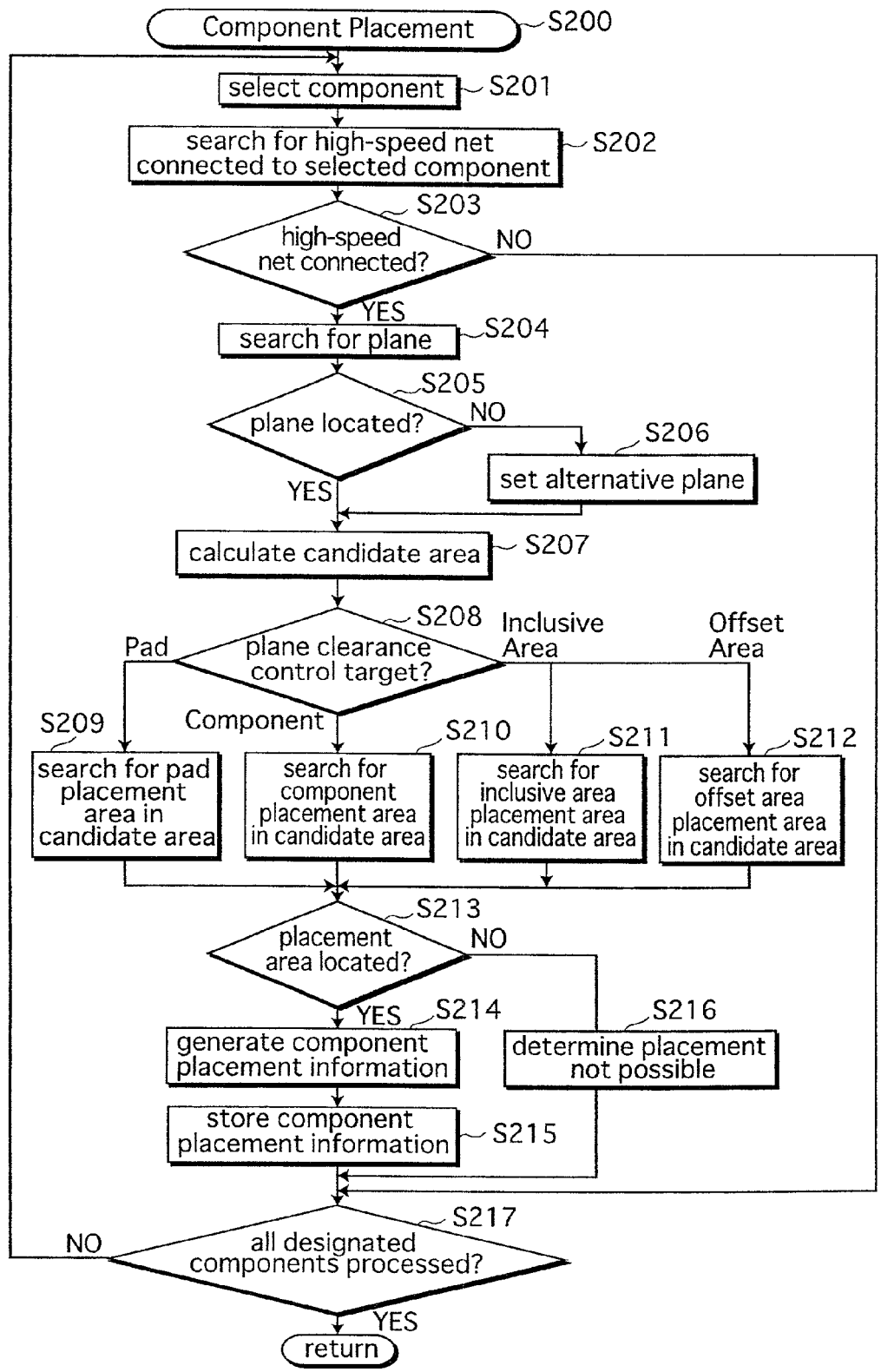
FIG. 20 is a flowchart of a component placement processing subroutine.

FIG. 20 is a flowchart of the component placement processing subroutine.

Step S201: Component placement unit 1300 selects one of the component ID names specified in the parameters.

Step S202: Unit 1300 retrieves from table 440 (FIG. 10), net information showing the pin ID names corresponding to the selected component ID name. Unit 1300 also retrieves from table 440, net information showing a frequency greater than or equal to a first threshold, a rise time less than or equal to a second threshold, and a fall time less than or equal to a third threshold.

The first, second, and third thresholds are provided in advance to apparatus 1000 from an external source and stored in a memory unit (not shown in the drawings).

By way of example, let the selected component ID be "IC1", and the first, second, and third thresholds be 30 MHz, 1.4 ns, and 1.35 ns, respectively. As such, net information corresponding to the net ID name "clk1" is retrieved from a search of table 440.

Step S203: If net information is not retrieved from the search of table 440, unit 1300 proceeds to step s217.

Step S204: On the other hand, if net information is retrieved, unit 1300 searches table 460 (FIG. 12) for foil placement information showing the form type as "plane".

Step S205: If foil placement information showing "plane" is not retrieved from the search, unit 1300 proceeds to step s206.

Step S206: Unit 1300 assumes that the form type is "plane" and that foil placement information showing the coordinates of a placement area of the plane (i.e. within an area of the wiring board surface excluding a perimeter area having a predetermined margin) was retrieved from the search of table 460.

The coordinates of the placement area of the plane shown in the assumed foil placement information are calculated as follows. Unit 1300 acquires the coordinates of the board stored in structural point column 401 of board information table 400 (FIG. 6). Unit 1300 also acquires, from clearance information table 480 (FIG. 27) as the predetermined margin, the clearance value to be maintained between the component and the edge of the board. Unit 1300 then shifts, by an amount equal to the acquired clearance value, the points of the acquired coordinates to be within an area marked by lines connecting each of the acquired coordinate points, and calculates the coordinates of the shifted points. The calculated coordinates show the vertices of the placement area of the plane.

Step S207: Unit 1300 acquires from table 430 (FIG. 9) component information corresponding to the selected component ID name (i.e. "IC1" in the given example).

Depending on whether the area type specified in the parameters is 1, 2, 3, or 4, unit 1300 then selects, respectively, the component pad clearance value, the component clearance value, the inclusive area clearance value, or the offset area clearance value included in the acquired component information.

If the relevant clearance values are not specified in the acquired component information, unit 1300 acquires clearance values from table 490 (FIG. 14) and selects the clearance value corresponding to the area type specified in the parameters.

Unit 1300 then shifts, by an amount equal to the selected clearance value, the points of either the coordinates included in the retrieved foil placement information or the coordinates calculated in step S206 to be within an area marked by lines connecting each of the points, and calculates the coordinates of the shifted points. Unit 1300 recognizes the area marked by lines connecting each of the calculated points as the candidate area of the component.

Step S208: Depending on the area type included in the parameter, unit 1300 executes one of steps s210, s211, and s212.

Step S209: Unit 1300 searches for a component placement area in which the component pad area of the component identified by the selected component ID name (i.e. "IC1") is included within the recognized candidate area.

This processing operation may be conducted, for example, as follows. First, unit 1300 uses a method applied by a prior art design aiding apparatus to determine the component placement area. The determined placement area is shown by the XY coordinate of the placement point of the component, as well as by the angle (i.e. placement angle) between the X axis and the reference direction. Here, the determined placement area satisfies the clearance values shown in table 480 (FIG. 27), although no consideration has been given to the margin between the component placement area and the edge of the plane.

Next, unit 1300 judges whether the component pad area of the component placed according to the determined placement point and placement angle are included within the recognized candidate area.

If judged in the negative, unit 1300 calculates the size in the XY direction of the section of the component pad area deviating outside the candidate area. Then, so as to eliminate the deviation, unit 1300 then either (i) shifts the placement point by an amount greater than or equal to the calculated size of the deviating section, (ii) amends the placement angle, or (iii) amends both the placement point and angle.

If the component placed in accordance with the amended placement point and/or angle, or the component pads are subject to interference from other components, wiring foils, or vias that have already been placed, unit 1300 searches in a predetermined area around the placement point and angle determined by amendment for a placement point and/or angle that does not result in interference.

Step S210: Unit 1300 searches for a component placement area in which the main body area of the component identified by the selected component ID name (i.e. "IC1") is included within the recognized candidate area.

As with step s209, this processing operation involves unit 1300 firstly using the prior art method to determine the placement point and angle of the component, and then if the main body area of the component placed in accordance with the determined placement point and angle deviates outside of the candidate area, unit 1300 amends the placement area in order to eliminate the deviation. If any interference arises from other elements, unit 1300 alters at least one of the placement point and angle so as to eliminate the interference.

Step S211: Unit 1300 searches for a component placement area in which the inclusive area of the component identified by the selected component ID name is included within the recognized candidate area.

As with step s209, this processing operation involves unit 1300 firstly using the prior art method to determine the placement point and angle of the component, and then if the inclusive area of the component placed in accordance with the determined placement point and angle deviates outside of the candidate area, unit 1300 amends the placement area in order to eliminate the deviation. If any interference arises from other elements, unit 1300 alters at least one of the placement point and angle so as to eliminate the interference.

Step S212: Unit 1300 searches for a component placement area in which the offset area of the component identified by the selected component ID name is included within the recognized candidate area.

As with step s209, this processing operation involves unit 1300 firstly using the prior art method to determine the placement point and angle of the component, and then if the offset area of the component placed in accordance with the determined placement point and angle deviates outside of the candidate area, unit 1300 amends the placement area in order to eliminate the deviation. If any interference arises with other elements, unit 1300 alters at least one of the placement point and angle so as to eliminate the interference.

Step S213: If in any of the searches conducted in steps s209 through s212, a component placement area that eliminates deviation outside the candidate area and interference from other elements cannot be found, unit 1300 proceeds to the step s216.

Step S214: Unit 1300 generates component placement information that includes the placement point and angle determined or amended as a result of any of the searches.

Step S215: Unit 1300 stores the generated component placement information in table 450 (FIG. 11).

Step S216: Unit 1300 judges whether placement of the component identified by the selected component ID name is possible.

Step S217: Unit 1300 repeats the processing operations from step s201 with respect to component ID names specified in the parameters but having yet to undergo processing.

Wiring Processing

Wiring unit 1400 is mobilized by control unit 1020 when the information acquired by input unit 1010 shows a wiring command. In this case, unit 1400 receives from control unit 1020 the parameters included in the command information, and executes the component placement processing based on the received parameters.

In FIG. 2, cell 208 shows exemplary parameters transferred to unit 1400 by control unit 1020. The transferred parameters include one or more net ID names.

Figure 21:
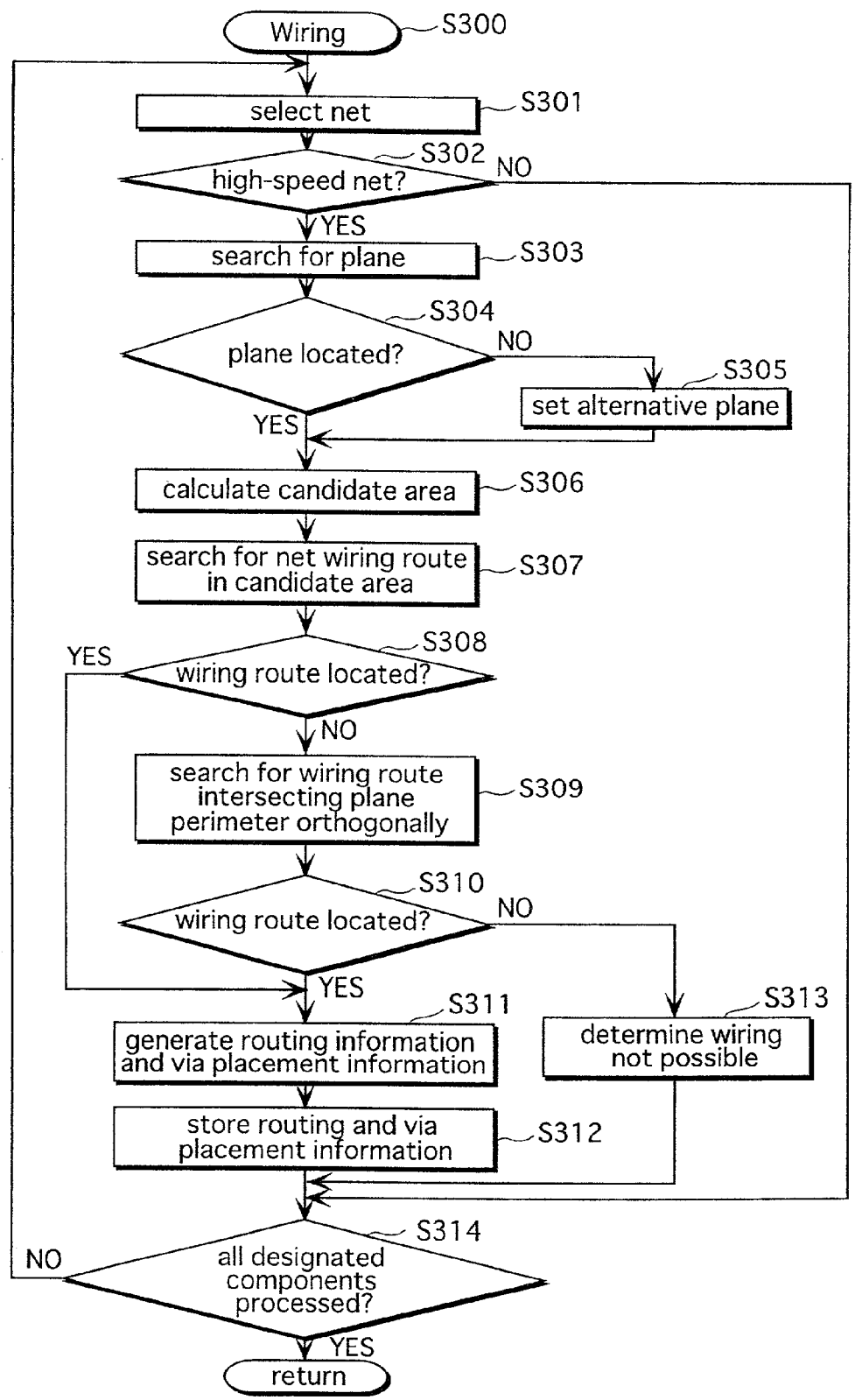
FIG. 21 is a flowchart of a wiring processing subroutine.

FIG. 21 is a flowchart of the wiring processing subroutine.

Step S301: Wiring unit 1400 selects one of the net ID names specified in the parameters.

Step S302: Unit 1400 searches table 440 (FIG. 10) for net information that includes the selected net ID name. Unit 1400 also searches for a frequency greater than or equal to the first threshold, a rise time less than or equal to the second threshold, and a fall time less than or equal to the third threshold.

The first, second, and third threshold are provided in advance to design aiding apparatus 1000 from an external source, and stored in a memory unit (not shown in the drawings).

If net information is not retrieved from the search, unit 1400 proceeds to step s314.

Step S303: Unit 1400 searches table 460 (FIG. 12) for foil placement information in which the form type is given as "plane".

Step S304: If foil placement information showing "plane" is not retrieved from the search, unit 1400 proceeds to step s305.

Step S305: Unit 1400 assumes that the form type is "plane" and that foil placement information showing the coordinates of a placement area of the plane (i.e. within an area of the wiring board surface excluding a perimeter area having a predetermined margin) was retrieved from the search of table 460.

The coordinates of the placement area of the plane shown in the assumed foil placement information are calculated as follows. Unit 1400 acquires the coordinates of the board stored in structural point column 401 of board information table 400 (FIG. 6). Unit 1400 also acquires, from clearance information table 480 (FIG. 27) as the predetermined margin, the clearance value to be maintained between the wiring foil and the edge of the board. Unit 1400 then shifts, by an amount equal to the acquired clearance value, the points of the acquired coordinates to be within an area marked by lines connecting each of the acquired coordinate points, and calculates the coordinates of the shifted points. The calculated coordinates show the vertices of the placement area of the plane.

Step S306: Unit 1400 acquires from table 440 (FIG. 10) net information corresponding to the selected net ID name.

If the wiring foil and via pad clearance values are not specified in the acquired net information, unit 1400 acquires the relevant clearance values from plane clearance information table 490 (FIG. 14).

Unit 1400 then shifts, by an amount equal to the acquired wiring foil clearance value, the points of the coordinates included in the foil placement information retrieved in step s303 or assumed to have been retrieved in step S305 to be within an area marked by lines connecting each of the points, and calculates the coordinates of the shifted points. Unit 1400 recognizes the area marked by lines connecting each of the calculated points as the wiring foil candidate area.

Unit 1400 also shifts, by an amount equal to the acquired via pad clearance value, the points of the coordinates included in the foil placement information retrieved in step s303 or assumed to have been retrieved in step S305 to be within an area marked by lines connecting each of the points, and calculates the coordinates of the shifted points. Unit 1400 recognizes the area marked by lines connecting each of the calculated points as the via candidate area.

Step S307: Unit 1400 determines the placement area of wiring foils and vias connected to the pins of the component identified by the pin ID name shown in the acquired net information.

This processing operation may, for example, be conducted as follows. Firstly, unit 1400 applies the prior art method to determine the placement area of the wiring foils and vias. Here, the determined placement areas satisfy the clearance values shown in table 480 (FIG. 27), although no consideration has been given to the margin between the wiring foil/via placement areas and the edge of the plane.

Next, unit 1400 judges whether the pads of the wiring foils and vias placed in the determined placement areas are included within the recognized wiring foil and via candidate areas, respectively.

If judged in the negative, unit 1400 calculates the size in the XY direction of the section deviating from the wiring foil and via candidate areas, and amends the respective placement areas so as to eliminate the deviation.

If the wiring foils and/or vias placed in amended placement areas are subject to interference from other components, wiring foils, or vias already placed, unit 1400 searches in a predetermined area around the amended placement area/s for placement area/s that do not result in interference.

Step S308: If a placement area is located that eliminates both derivation of the wiring foils and via pads and interference from other elements, unit 1400 proceeds to step s311.

Step S309: Unit 1400 judges whether the overlap between the wiring foil placement and a perimeter area of the plane excluding the wiring foil candidate area from the plane placement area retrieved or assumed to have been retrieved, is small enough to satisfy a predetermined condition. If judged in the negative, unit 1400 searches for a placement area that satisfied the predetermined condition and does not result in interference from other elements.

Figure 24A:
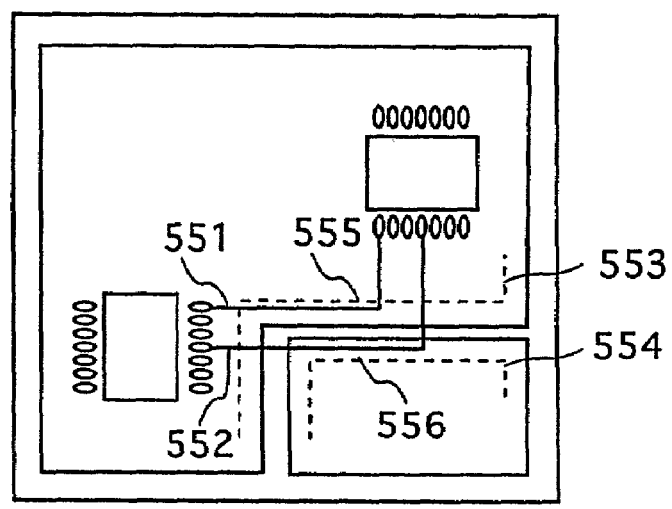
FIG. 24A is a top down view showing a situation in which it is not possible to determine the placement area of the wiring foils to be within a wiring foil candidate area.
Figure 24B:
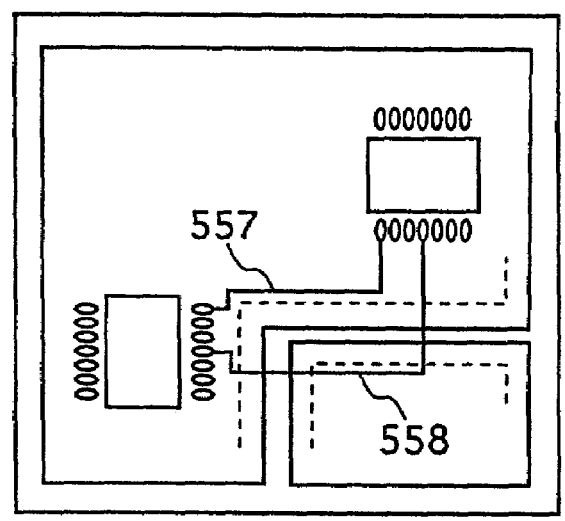
FIG. 24B is a top down view showing the use of an alternative area in the placement of the wiring foils.

The judgment by unit 1400 can be conducted, for example, in terms of whether or not the centerline of the wiring foil placement area cuts the perimeter area of the plane orthogonally. As shown in FIG. 24A, if wiring foils 551 and 552 deviate outside the wiring foil candidate areas 553 and 554, respectively, so as to be placed within the perimeter areas 555 and 556, respectively, of the plane, unit 1400 can judge in the negative and alter placement areas 552 and 553 to alternative placement areas 557 and 558, respectively, such that, as shown in FIG. 24B, the centerline of alternative placement area 558 cuts perimeter area 556 orthogonally and the centerline of alternative placement area 557 does not cut perimeter area 555 at all.

Step S310: If placement area/s cannot be found in which the overlap with the perimeter area of the plane is small enough to satisfy the predetermined condition and in which no interference arises from other elements, unit 1400 proceeds to step s313.

Step S311: Unit 1400 generates foil placement information marked as the form type "line" (i.e. routing information) and via placement information, which show respectively the placement area of the wiring foils and vias determined in one of steps s307 and s309.

Step S312: Unit 1400 stores the generated foil placement and via placement information in tables 460 (FIG. 12) and 470 (FIG. 13), respectively.

Step S313: Unit 1400 judges whether it is possible to place the wiring foils and vias belonging to the net identified by the selected net ID name.

Step S314: Unit 1400 repeats the processing operations from step s301 with respect to net ID names specified in the parameters but having yet to undergo processing.

Component Placement Inspection Processing

Component placement inspection unit 1500 is mobilized by control unit 1020 when the information acquired by input unit 1010 shows a component placement inspection command. In this case, unit 1500 receives from control unit 1020 the parameters included in the command information, and executes the component placement inspection processing based on the received parameters.

In FIG. 2, cell 209 shows exemplary parameters transferred to unit 1500 by control unit 1020. The transferred parameters include in the stated order, the area type, and one or more component ID names. The area type of the component pad area, the main body area, the inclusive area, and the offset area is specified using the numbers 1, 2, 3, and 4, respectively.

Figure 22:
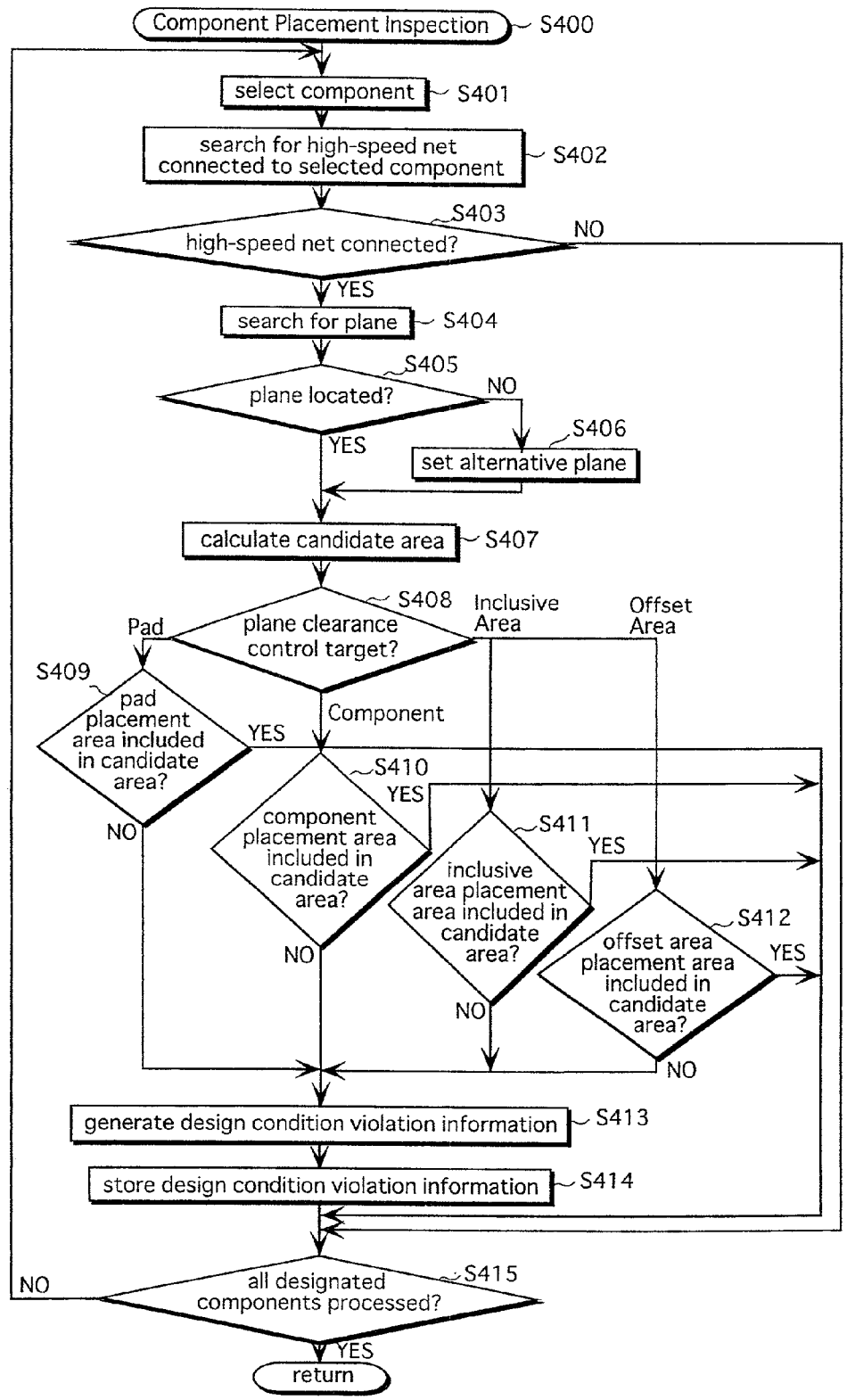
FIG. 22 is a flowchart of a component placement inspection processing subroutine.

FIG. 22 is a flowchart of the component placement inspection processing subroutine.

Step S401: Component placement inspection unit 1500 selects one of the component ID names specified in the parameters.

Step S402: Unit 1500 searches table 440 (FIG. 10) for net information showing the pin ID names corresponding to the selected component ID name. Unit 1500 also retrieves from table 440, net information showing a frequency greater than or equal to a first threshold, a rise time less than or equal to a second threshold, and a fall time less than or equal to a third threshold.

The first, second, and third threshold are provided in advance to design aiding apparatus 1000 from an external source, and stored in a memory unit (not shown in the drawings).

Step S403: If net information is not retrieved from the search of table 440, unit 1500 proceeds to step s415.

Step S404: On the other hand, if net information is retrieved, unit 1500 searches table 460 (FIG. 12) for foil placement information showing the form type as "plane".

Step S405: If foil placement information showing "plane" is not retrieved from the search, unit 1500 proceeds to step s406.

Step S406: Unit 1500 assumes that the form type is "plane" and that foil placement information showing the coordinates of a placement area of the plane (i.e. within an area of the wiring board surface excluding a perimeter area having a predetermined margin) was retrieved from the search of table 460. The calculation of the coordinates of the placement area of the plane is the same as in step s206.

Step S407: Unit 1500 acquires from table 430 (FIG. 9) component information corresponding to the selected component ID name.

Depending on whether the area type specified in the parameter is 1, 2, 3, or 4, unit 1500 then selects, respectively, the component pad clearance value, the component clearance value, the inclusive area clearance value, or the offset area clearance value included in the acquired component information.

If the relevant clearance values are not specified in the acquired component information, unit 1500 acquires clearance values from table 490 (FIG. 14) and selects the clearance value corresponding to the area type specified in the parameters.

Unit 1500 then shifts, by an amount equal to the selected clearance value, the points of either the coordinates included in the retrieved foil placement information or the coordinates calculated in step S406 to be within an area marked by lines connecting each of the points, and calculates the coordinates of the shifted points. Unit 1500 recognizes the area marked by lines connecting each of the calculated points as the candidate area of the, component.

Step S408: Depending on the area type included in the parameter, unit 1500 executes one of steps s409, s410, s411, and s412.

Step S409: Unit 1500 acquires from table 450 (FIG. 11) component placement information corresponding to the selected component ID name. If the component has been placed in accordance with the placement point and angle included in the acquired component placement information, unit 1500 judges whether the component pad area of the component is included within the candidate area. If judged in the affirmative, unit 1500 proceeds to step s415.

Step S410: Unit 1500 acquires from table 450 component placement information corresponding to the selected component ID name. If the component has been placed in accordance with the placement point and angle included in the acquired component placement information, unit 1500 judges whether the main body area of the component is included within the candidate area. If judged in the affirmative, unit 1500 proceeds to step s415.

Step S411: Unit 1500 acquires from table 450 component placement information corresponding to the selected component ID name. If the component has been placed in accordance with the placement point and angle included in the acquired component placement information, unit 1500 judges whether the inclusive area of the component is included within the candidate area. If judged in the affirmative, unit 1500 proceeds to step s415.

Step S412: Unit 1500 acquires from table 450 component placement information corresponding to the selected component ID name. If the component has been placed in accordance with the placement point and angle included in the acquired component placement information, unit 1500 judges whether the offset area of the component is included within the candidate area. If judged in the affirmative, unit 1500 proceeds to step s415.

Step S413: If judged in the negative, unit 1500 generates design condition violation information showing the area type included in the parameters and selected component ID name.

Step S414: Unit 1500 stores the generated design condition violation information in table 510 (FIG. 16).

Step S415: Unit 1500 repeats the processing operations from step s401 with respect to component ID names specified in the parameters but having yet to undergo processing.

Wiring Inspection Processing

Wiring inspection unit 1600 is mobilized by control unit 1020 when the information acquired by input unit 1010 shows a wiring inspection command. In this case, unit 1600 receives from control unit 1020 the parameters included in the command information, and executes the wiring inspection processing based on the received parameters.

In FIG. 2, cell 210 shows exemplary parameters transferred to unit 1600 by control unit 1020. The transferred parameters include one or more net ID names.

Figure 23:
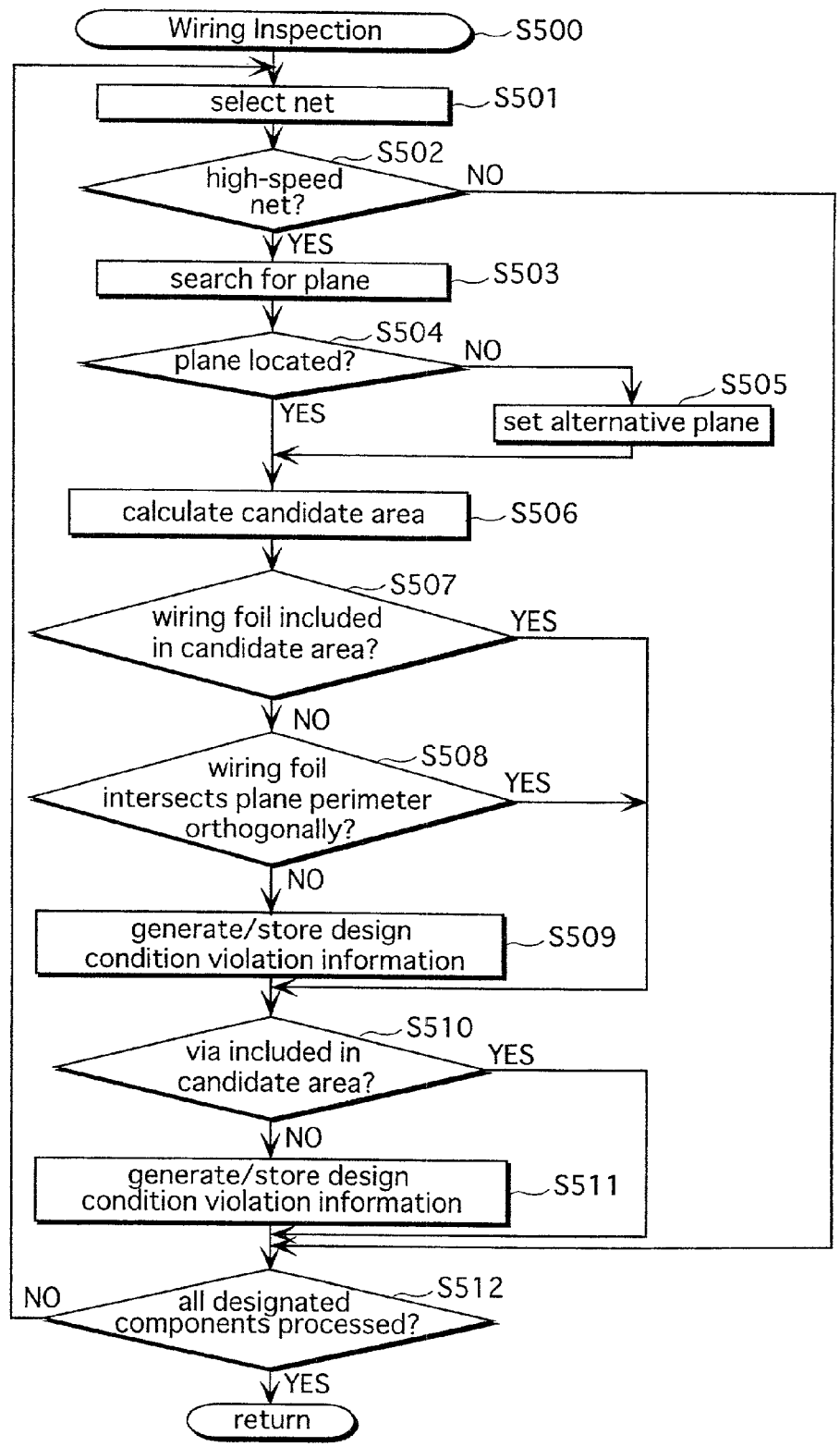
FIG. 23 is a flowchart of a wiring inspection processing subroutine.

FIG. 23 is a flowchart of the wiring inspection processing subroutine.

Step S501: Wiring inspection unit 1600 selects one of the net ID names specified in the parameters.

Step S502: Unit 1600 searches table 440 (FIG. 10) for net information corresponding to the selected net ID name. Unit 1300 also retrieves from table 440, net information showing a frequency greater than or equal to a first threshold, a rise time less than or equal to a second threshold, and a fall time less than or equal to a third threshold.

The first, second, and third threshold are provided in advance to design aiding apparatus 1000 from an external source and stored in a memory unit (not shown in the drawings).

If net information is not retrieved from the search of table 440, unit 1600 proceeds to step s512.

Step S503: On the other hand, if net information is retrieved, unit 1600 searches table 460 (FIG. 12) for foil placement information in which the form type is given as "plane".

Step S504: If foil placement information showing "plane" is not retrieved from the search, unit 1600 proceeds to step s505.

Step S505: Unit 1600 assumes that the form type is "plane" and that foil placement information showing the coordinates of a placement area of the plane (i.e. within an area of the wiring board surface excluding a perimeter area having a predetermined margin) was retrieved from the search of table 460. The calculation of the coordinates of the placement area of the plane is the same as in step s305.

Step S506: Unit 1600 acquires from table 440 (FIG. 10) net information corresponding to the selected net ID name.

If the wiring foil and via pad clearance values are not specified in the acquired net information, unit 1600 acquires the relevant clearance values from plane clearance information table 490 (FIG. 14).

Unit 1600 then shifts, by an amount equal to the acquired wiring foil clearance value, the points of the coordinates included in the foil placement information retrieved in step s503 or assumed to have been retrieved in step S505 to be within an area marked by lines connecting each of the points, and calculates the coordinates of the shifted points. Unit 1600 recognizes the area marked by lines connecting each of the calculated points as the wiring foil candidate area.

Unit 1600 also shifts, by an amount equal to the acquired via pad clearance value, the points of the coordinates included in the foil placement information retrieved in step s503 or assumed to have been retrieved in step S505 to be within an area marked by lines connecting each of the points, and calculates the coordinates of the shifted points. Unit 1600 recognizes the area marked by lines connecting each of the calculated points as the via candidate area.

Step S507: Unit 1600 searches table 460 (FIG. 12) for routing information corresponding to the selected net ID name and showing the section of the wiring foil placement area deviating outside the wiring foil candidate area. If the relevant routing information is not retrieved from the search, unit 1600 proceeds to step s510.

Step S508: Unit 1600 judges whether the overlap between the placement area/s shown in the retrieved one or more pieces of routing information and a perimeter area of the plane excluding the wiring foil candidate area from the plane placement area retrieved or assumed to have been retrieved, is small enough to satisfy a predetermined condition.

The judgment by unit 1600 can be conducted, for example, in terms of whether or not the centerline of the wiring foil placement area intersects the perimeter area of the plane orthogonally.

If judged that the predetermined condition is satisfied for all of the retrieved pieces of routing information, unit 1600 proceeds to step s510.

Step S509: Unit 1600 generates (i) design condition violation information that includes one or more foil ID names showing the wiring foils judged not to satisfy the predetermined condition, and (ii) a name showing "wiring foil" as the area type of the target element. Unit 1600 then stores the generated design condition violation information in table 510 (FIG. 16).

Step S510: Unit 1600 searches table 470 (FIG. 13) for via placement information corresponding to the selected net ID name and showing the section of the via placement area deviating outside the via candidate area. If the relevant via placement information is not retrieved from the search, unit 1600 proceeds to step s512.

Step S511: If the relevant via placement information is retrieved, unit 1600 generates design condition violation information showing the ID name and element name of the one or more vias corresponding to the retrieved information, and stores the generated design condition violation information in table 510 (FIG. 16).

Step S512: Unit 1600 repeats the processing operations from step s501 with respect to net ID names specified in the parameters but having yet to undergo processing.

Variations

Although described in terms of the above embodiment, the present invention is by no means limited to this embodiment, and may include the following variations.

(1) The invention may be a method that includes, as steps, the processing described in the embodiment. Furthermore, the invention may be a computer program executed by a computer system to realize a design aiding apparatus applying the method, or the invention may be a digital signal that expresses the computer program.

Alternatively, the invention may be a computer-readable storage medium, such as a flexible disc, a hard disk, a CD-ROM, an MO, a DVD, a DVD-ROM, a DVD-RAM, or a semi-conductor memory, which stores the computer program or the digital signal.

Alternatively, the computer program or the digital signal may be transmitted via a network such as a telecommunications circuit, a wireless communications circuit, a cable communications circuit, or the Internet.

The invention may also be a computer system that includes a microprocessor and memory. Here, the memory may store the computer program, and the method may be realized by the microprocessor operating in accordance with the computer program stored in the memory.

Alternatively, the computer program or the digital signal may be sent, either stored on the storage medium or via the network, to an independent computer system which then implements the computer program or digital signal.

(2) The plane clearance information may be calculated in advance using simulation, and then provided to and stored in the design aiding apparatus of the present invention.

(3) The plane clearance information may be regulated separately for each wiring surface. FIG. 25 shows an exemplary plane clearance information table 520 used in this variation of the invention.

In table 520, rows 521 to 527 show, respectively, a target surface, a component pad clearance value, a component clearance value, an inclusive area clearance value, an offset area clearance value, a wiring foil clearance value, and a via pad clearance value.

Row 521 stores wiring surface numbers showing two wiring surfaces for each column. When the plane is placed on one of the wiring surfaces shown in one of the columns of row 521, rows 522 to 527 store the margins allowable between the edge of the plane and, respectively, the component pad area, the main body area, the inclusive area, the offset area, the wiring foil, and the via pad placed on the other surface.

(4) In case of plural pieces of foil placement information showing the form type as "plane" being retrieved from the search of table 460 (FIG. 12), the candidate area of a component, wiring foil, or via targeted for placement may be calculated based on the placement area of the plane positioned on a wiring surface closest to the wiring surface on which the component, wiring foil, or via is to be placed. The placement area of the component, wiring foil, or via can then be determined such that it is included within the calculated candidate area.

(5) In case of plural pieces of foil placement information showing the form type as "plane" being retrieved from the search of table 460 (FIG. 12), the candidate area of a component, wiring foil, or via targeted for placement may be calculated based on the combined area of all the planes shown in the retrieved information. The placement area of the component, wiring foil, or via may then be determined such that it is included within the calculated candidate area.

Figure 26:
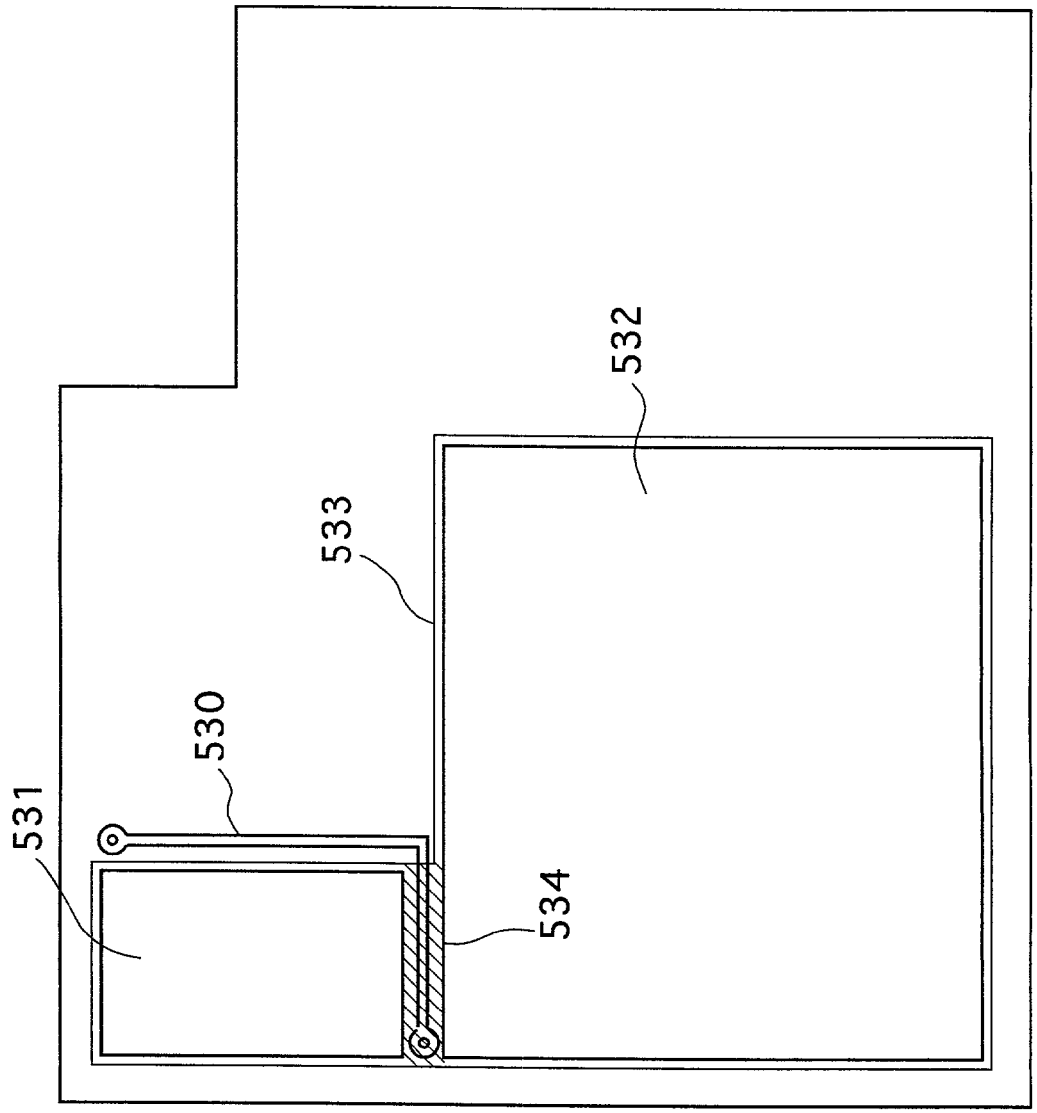
FIG. 26 is a top down view of an area that includes a plurality of planes.

This variation is shown in FIG. 26. FIG. 26 shows two planes 531 and 532 placed so as to avoid wiring foil 530. Because the candidate area of the component, wiring foil, or via is calculated, according to the this variation, based on an area 533 that encompasses both planes 531 and 532, the shaded area 534 in FIG. 26 is added to the respective candidate areas calculated as described in the embodiment of the invention.

By sacrificing a little of the effectiveness of the EMI reduction measures, it becomes possible to mitigate placement restrictions regarding components, wiring foils, and vias, and increase the placement density on the wiring board.

(6) The planes included in the calculation of the component candidate area may be restricted to the ground and power planes supplying power to the component. Furthermore, the planes included in the calculation of the wiring foil and via candidate areas may be restricted to the ground and the power planes supplying power to the component to which the wiring foil and via are connected.

In particular, a ground plane and a wiring foil placed in a candidate area based on the placement area of the ground plane form a micro strip line, and consequently it is possible to achieve, in addition to EMI reductions, reductions in transmission loss and increases in noise tolerance.

(7) Wiring foils may be placed on a wiring surface sandwiched between two ground planes in an area of the ground planes excluding a perimeter area as seen in the lamination direction of the board.

According to this variation, a strip line is formed by the wiring foil and the two ground planes, and in comparison to the micro strip line formation it is possible to realize further increases in EMI reduction as well as the reductions in transmission loss and increases in noise tolerance.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A design aiding apparatus for placing components on a multilayer wiring board with consideration for electromagnetic compatibility quality, comprising:

an information storage unit operable to store design information that includes design criterion information, component information, pin information and net information;

a plane foil-layer determining unit operable to determine a layer for placing a plane foil;

a plane foil-area determining unit operable to determine a plane foil-area for placing the plane foil on the plane foil-layer;

a perimeter-area detecting unit operable to detect a perimeter-area having a predetermined margin on the edge of the plane foil-area;

a prohibited-area determining unit operable to determine an area on a different layer corresponding to the perimeter-area as a prohibited-area; and a placing unit operable to place components within an area on the different layer corresponding to the plane foil-area excluding the prohibited-area.

2. The design aiding apparatus of claim 1, wherein the perimeter-area detecting unit includes:

a judging subunit operable to judge whether the plane-foilarea has been determined;

an acquiring subunit operable, if judged in the negative, to acquire a wiring-board shape and a board clearance value from the design criterion information; and a determining subunit operable to determine, with respect to the wiring-board shape, an area reduced by the board clearance value as an imaginary plane-foil-area, and detects a perimeter-area of the imaginary plane-foil-area as the perimeter-area.

3. The design aiding apparatus of claim 2 further comprising:

a wiring possibility judgment unit operable, when all of foils which connect the components are not able to wire within an area on a different layer corresponding to the plane foil-area excluding the prohibited-area, to wire an area of a different layer that corresponds to another plane foil-area and on the prohibited-area to minimize electromagnetic interference.

4. The design aiding apparatus of claim 3 wherein the wiring possibility judgment unit wires the part of the foils to intersect a prohibited-area perimeter orthogonally.

5. The design aiding apparatus of claim 1, wherein the placing unit includes:

a net detecting subunit operable to detect a high-speed net with reference to a pre-determined threshold, and places any component connected to a detected high-speed net so that at least one of a placement area, a shape and a pin of the component avoids the prohibited-area and is within the area on the different layer corresponding to the plane foil-area excluding the prohibited-area.

6. The design aiding apparatus of claim 1 further comprising:

a wiring possibility judgment unit operable, when all of foils which connect the components are not able to wire within an area on a different layer corresponding to the plane foil-area excluding the prohibited-area, to wire on an area of a different layer that corresponds to another plane foil-area and on the prohibited-area to minimize electromagnetic interference.

7. The design aiding apparatus of claim 6 wherein the wiring possibility judgment unit wires the part of the foils to intersect a prohibited-area perimeter orthogonally.

8. A design aiding apparatus for wiring foils and vias on a multilayer wiring board with consideration for electromagnetic compatibility quality, comprising:

an information storage unit operable to store design information that includes design criterion information, component information, pin information and net information;

a plane foil-layer determining unit operable to determine a layer for placing a plane foil;

a plane foil-area determining unit operable to determine a plane foil-area for placing the plane foil on the plane foil-layer;

a perimeter-area detecting unit operable to detect a perimeter-area having a predetermined margin on the edge of the plane foil-area;

a prohibited-area determining unit operable to determine an area on a different layer corresponding to the perimeter-area as a prohibited-area; and a wiring unit operable to wire foils and vias within an area on the different layer corresponding to the plane foil-area excluding the prohibited-area.

9. The design aiding apparatus of claim 8, wherein the perimeter-area detecting unit includes:

a judging subunit operable to judge whether the plane-foil-area has been determined;

an acquiring subunit operable, if judged in the negative, to acquire a wiring-board shape and a board clearance value from the design criterion information; and a determining subunit operable to determine, with respect to the wiring-board shape, an area reduced by the board clearance value as an imaginary plane-foil-area, and detects a perimeter-area of the imaginary plane foil-area as the perimeter-area.

10. The design aiding apparatus of claim 9 further comprising:

a wiring possibility judgment unit operable, when all of foils which connect the components are not able to wire within an area on a different layer corresponding to the plane foil-area excluding the prohibited-area, to wire part of the foils on an area of a different layer that corresponds to another plane foil-area and on the prohibited-area to minimize electromagnetic interference.

11. The design aiding apparatus of claim 10 wherein the wiring possibility judgment unit wires the part of the foils to intersect a prohibited-area perimeter orthogonally.

12. The design aiding apparatus of claim 8, wherein the wiring unit includes:

a net detecting subunit operable to detect a high-speed net with reference to a predetermined threshold, and to wire at least one of any foil and any via belonging to a detected high-speed net so as to be within the area on the different layer corresponding to the plane foil-area excluding the plane foil-area.

13. The design aiding apparatus of claim 8, wherein the wiring unit performs the wiring without consideration for the prohibited-area in relation to foils lying orthogonal to an edge of the plane foil-area, and performs the wiring within the area on the different layer corresponding to the plane foil-area excluding the prohibited area in relation to foils lying parallel to the edge of the plane-foil-area.

14. A machine-readable recording medium having recorded thereon a computer program for having a computer execute the steps of:

storing design information that includes design criterion information, component information, pin information and net information;

determining a plane foil-layer that is a layer for placing a plane foil;

determining a plane foil-area that is an area for placing the plane foil on the plane foil-layer;

detecting a perimeter-area having a predetermined margin on the edge of the plane foil-area;

determining an area on a different layer corresponding to the perimeter area as a prohibited-area; and placing components within an area on the different layer corresponding to the plane foil-area excluding the prohibited-area.

15. The invention of claim 14 further including a step of determining when a wiring foil location must overlap the prohibited-area and providing a wiring route intersecting a prohibited-area perimeter orthogonally to minimize electromagnetic interference.

16. A machine-readable recording medium having recorded thereon a computer program for having a computer execute the steps of:
 storing design information that includes design criterion information, component information, pin information and net information;
 determining a plane foil-layer that is a layer for placing a plane foil;
 determining a plane foil-area that is an area for placing the plane foil on the plane foil-layer;
 detecting a perimeter-area having a predetermined margin on the edge of the plane-foil-area;
 determining an area on a different layer corresponding to the perimeter-area as a prohibited-area; and
 wiring foils and vias within an area on the different layer corresponding to the plane foil-area excluding the prohibited-area.

17. The invention of claim 16 further including a step of determining when a wiring foil location must overlap the prohibited-area and providing a wiring route intersecting a prohibited-area perimeter orthogonally to minimize electromagnetic interference.

* * * * *

UNITED STATES PATENT AND TRADEMARK OFFICE
CERTIFICATE OF CORRECTION

PATENT NO. : 7,257,792 B2  Page 1 of 1
APPLICATION NO. : 10/151368
DATED : August 14, 2007
INVENTOR(S) : Nakayama et al.

It is certified that error appears in the above-identified patent and that said Letters Patent is hereby corrected as shown below:

In the Claims:
In Claim 2, Column 31, line 12, "plane-foilarea" should be --plane foil-area--
In Claim 2, Column 31, line 19, "plane-foil-area" should be --plane foil-area--
In Claim 2, Column 31, line 20, "plane-foil-area" should be --plane foil-area--
In Claim 9, Column 32, line 12, "plane-foil-area" should be --plane foil-area--
In Claim 9, Column 32, line 19, "plane-foil-area" should be --plane foil-area--
In Claim 13, Column 32, line 49, "plane-foil-area" should be --plane foil-area--
In Claim 16, Column 34, line 2, "plane-foil-area" should be --plane foil-area--

Signed and Sealed this

Eleventh Day of March, 2008

JON W. DUDAS
*Director of the United States Patent and Trademark Office*